(12) United States Patent
Ting et al.

(10) Patent No.: US 8,866,250 B2
(45) Date of Patent: *Oct. 21, 2014

(54) MULTIPLE METAL FILM STACK IN BSI CHIPS

(71) Applicant: Taiwan Semiconductor Manufacturing Company, Ltd., Hsin-Chu (TW)

(72) Inventors: Shyh-Fann Ting, Kaohsiung (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/789,820

(22) Filed: Mar. 8, 2013

(65) Prior Publication Data

US 2014/0061839 A1 Mar. 6, 2014

Related U.S. Application Data

(63) Continuation-in-part of application No. 13/604,380, filed on Sep. 5, 2012.

(51) Int. Cl.
*H01L 27/146* (2006.01)
*H01L 21/00* (2006.01)

(52) U.S. Cl.
CPC ..... *H01L 27/14623* (2013.01); *H01L 27/14685* (2013.01); *H01L 27/14621* (2013.01); *H01L 27/14627* (2013.01); *H01L 27/14636* (2013.01); *H01L 27/1464* (2013.01)
USPC ........................................... 257/448; 438/70

(58) Field of Classification Search
CPC ................... H01L 27/1464; H01L 27/14636; H01L 21/76838; H01L 27/14623; H01L 27/14621
USPC .............................. 257/448; 438/73, 634, 72
See application file for complete search history.

(56) References Cited

U.S. PATENT DOCUMENTS

| | | | |
|---|---|---|---|
| 7,101,726 B2 * | 9/2006 | Yamamoto et al. | 438/69 |
| 8,233,066 B2 * | 7/2012 | Zheng et al. | 348/294 |
| 8,426,938 B2 * | 4/2013 | Park et al. | 257/459 |
| 8,435,824 B2 * | 5/2013 | Tsai et al. | 438/65 |
| 8,502,389 B2 * | 8/2013 | Ho et al. | 257/774 |
| 8,564,135 B2 * | 10/2013 | Pyo | 257/773 |
| 2013/0105924 A1 * | 5/2013 | Kobayashi et al. | 257/431 |
| 2013/0112849 A1 * | 5/2013 | Shimotsusa | 250/206 |
| 2013/0153901 A1 * | 6/2013 | JangJian et al. | 257/49 |

* cited by examiner

*Primary Examiner* — William D Coleman
(74) *Attorney, Agent, or Firm* — Slater & Matsil, L.L.P.

(57) ABSTRACT

A device includes a semiconductor substrate, a black reference circuit in the semiconductor substrate, a metal pad on a front side of, and underlying, the semiconductor substrate, and a first and a second conductive layer. The first conductive layer includes a first portion penetrating through the semiconductor substrate to connect to the metal pad, and a second portion forming a metal shield on a backside of the semiconductor substrate. The metal shield is aligned to the black reference circuit, and the first portion and the second portion are interconnected to form a continuous region. The second conductive layer includes a portion over and contacting the first portion of the first conductive layer, wherein the first portion of the first conductive layer and the portion of the second conductive layer form a first metal pad. A dielectric layer is overlying and contacting the second portion of the first conductive layer.

20 Claims, 20 Drawing Sheets

MULTIPLE METAL FILM STACK IN BSI CHIPS

This application is a continuation-in-part application of the following commonly-assigned U.S. patent application Ser. No. 13/604,380, filed Sep. 5, 2012, and entitled "Multiple Metal Film Stack in BSI Chips," which application is hereby incorporated herein by reference.

BACKGROUND

Backside Illumination (BSI) image sensor chips are replacing front-side illumination sensor chips for their higher efficiency in capturing photons. In the formation of the BSI image sensor chips, image sensors and logic circuits are formed in a semiconductor substrate of a wafer, followed by the formation of an interconnect structure on a front side of the silicon chip.

The image sensors in the BSI image sensor chips generate electrical signals in response to the stimulation of photons. The magnitudes of the electrical signals (such as the photo-current) depend on the intensity of the incident light received by the respective image sensors. The image sensors, however, suffer from non-optically generated signals, which include the leakage signals, thermally generated signals, dark currents, and the like. Accordingly, the electrical signals generated by the image sensors need to be calibrated, so that the undesirable signals are cancelled out from the output signals of the image sensors. To cancel the non-optically generated signals, black reference image sensors are formed, and are used to generate non-optically generated signals. The black reference image sensors, therefore, need to be blocked from receiving light signals.

The black reference image sensors are covered by a metal shield, which is formed on the backside of the semiconductor substrate, in which the image sensors are formed. Furthermore, backside metal pads are also formed on the backside of the semiconductor substrate for bonding or testing. The formation of each of the metal shield and the backside metal pads includes a deposition step and a patterning step. Accordingly, in the region that is directly over the image sensors, a metal deposition and an etch step is performed when the metal shield is formed, and a metal deposition and an etch step is performed when the backside metal pads are formed. The deposition steps and the etch steps may be performed using plasma. As a result, the image sensors may be damaged or degraded.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A multiple metal film scheme for forming a metal shield and a backside metal pad in a Backside Illumination (BSI) image sensor chip is provided in accordance with various exemplary embodiments. The intermediate stages of forming the metal shield and the backside metal pad are illustrated. The variations of the embodiments are discussed. Throughout the various views and illustrative embodiments, like reference numbers are used to designate like elements.

Figure 1:
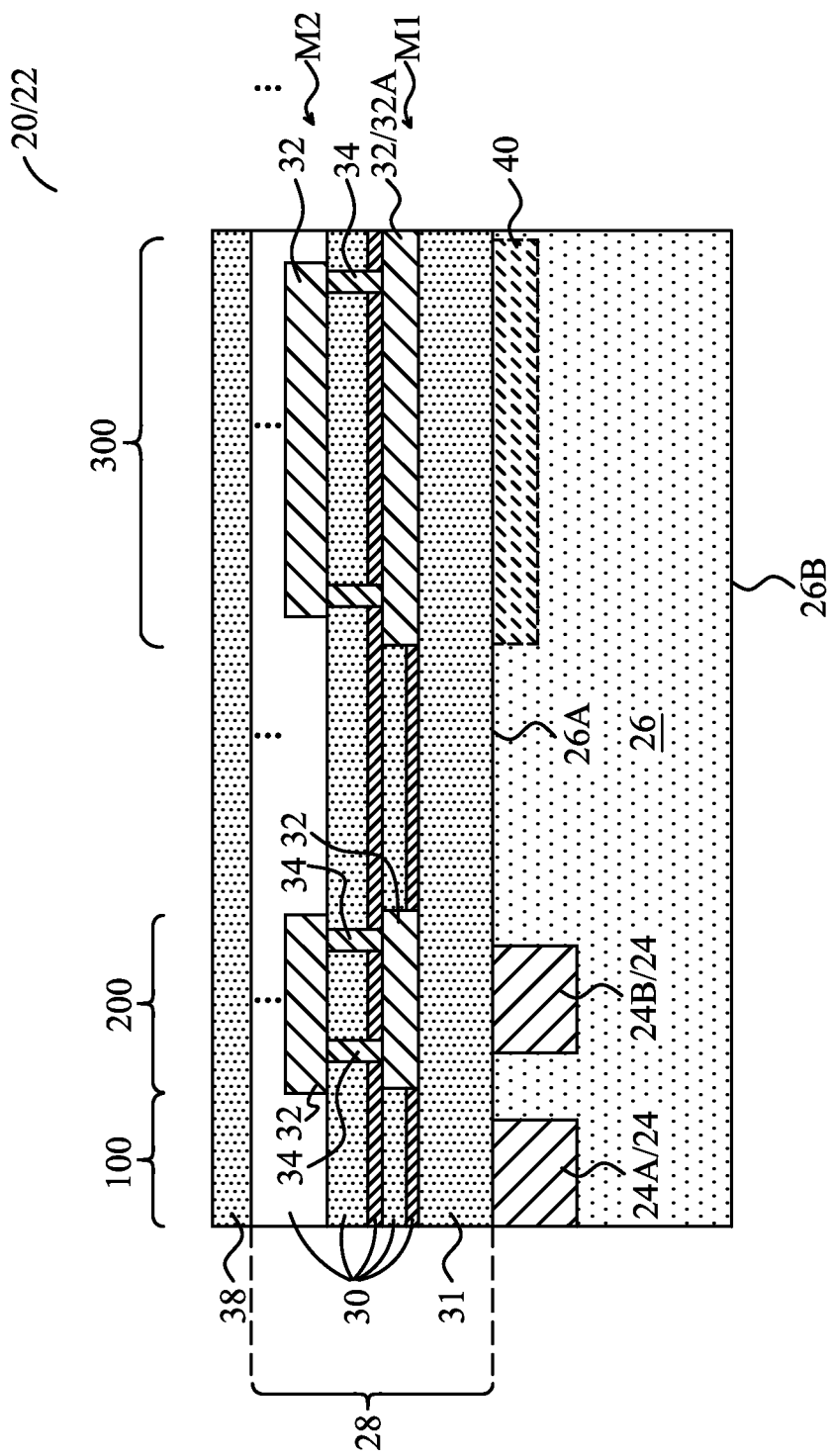
FIGS. 1 through 8 are cross-sectional views of intermediate stages in the manufacturing of a metal shield and a backside metal pad in accordance with some exemplary embodiments, wherein the metal shield and the backside metal pad are formed in a Backside Illumination (BSI) image sensor chip.

FIGS. 1 through 8 illustrate the cross-sectional views of intermediate stages in the manufacturing of the metal shield and the backside metal pad in accordance with some exemplary embodiments. FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed in semiconductor substrate 26. Image sensors 24 are configured to convert light signals (photons) to electrical signals, and may be photo-sensitive diodes or photo-sensitive MOS transistors. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes Inter-Layer Dielectric (ILD) 31, dielectric layers 30, and metal lines (or pads) 32 and vias 34 in dielectric layers 30. Although not shown, contact plugs are formed in ILD 31. Throughout the description, the metal lines and metal pads 32 in a same dielectric layer 30 are collectively referred to as being a metal layer. Front-side interconnect structure 28 includes metal layers includes M1, M2, etc., wherein metal layer M1 is the bottom metal layer of interconnect structure 28. In some exemplary embodiments, the lower layers in dielectric layers 30 are formed of low-k dielectric materials having low k values, for example, lower than about 3.0. The upper layer(s) in dielectric layer(s) 30 may be formed of low-k dielectric materials or non-low-k dielectric materials having k values greater than 3.9, or greater than about 4.5, for example. Passivation layer 38 is formed over interconnect structure 28. Passivation layer 38 may be formed of a non-low-k dielectric material having a k value greater than 3.9. In some embodiments, passivation layer 38 includes a silicon oxide layer and a silicon nitride layer on the silicon oxide layer.

Image sensor chip 20 includes active image sensor pixel region 100 and region 200. Region 200 includes a black reference pixel region and a peripheral circuit region, wherein the black reference circuit region and the peripheral circuit region are also shown as regions 428 and 430 in FIGS. 19 and 20. Active image sensor pixel region 100 includes active image sensors 24A formed therein, which is used for generating electrical signals from the sensed light. Although the details of image sensor 24A are not illustrated, there may be a plurality of image sensors 24A that form an active image sensor pixel array, wherein the entirety of the active image sensor pixel array is located in active image sensor pixel region 100. The black reference pixel region in region 200 includes black reference image sensor 24B formed therein, which is used for generating reference black level signals. The peripheral region includes logic devices for processing signals of the pixels. Similarly, although the details of image sensor 24B are not illustrated, there may be a plurality of image sensors 24B that form a black level reference pixel array. The entirety of the black level reference pixel array is located in region 200.

Image sensor chip 20 further includes metal pad region 300, in which a backside metal pad will be formed. In some exemplary embodiments, Shallow Trench Isolation (STI) region 40 is formed in metal pad region 300. In alternative embodiments, there may not be STI region formed in the illustrated metal pad region 300. STI region 40 may extend from front surface 26A of semiconductor substrate 26 into semiconductor substrate 26. Furthermore, metal pad 32A is located in metal pad region 300. Metal pad 32A may be in any metal layer, such as metal layer M1, metal layer M2, or the like, in interconnect structure 28.

Figure 2:
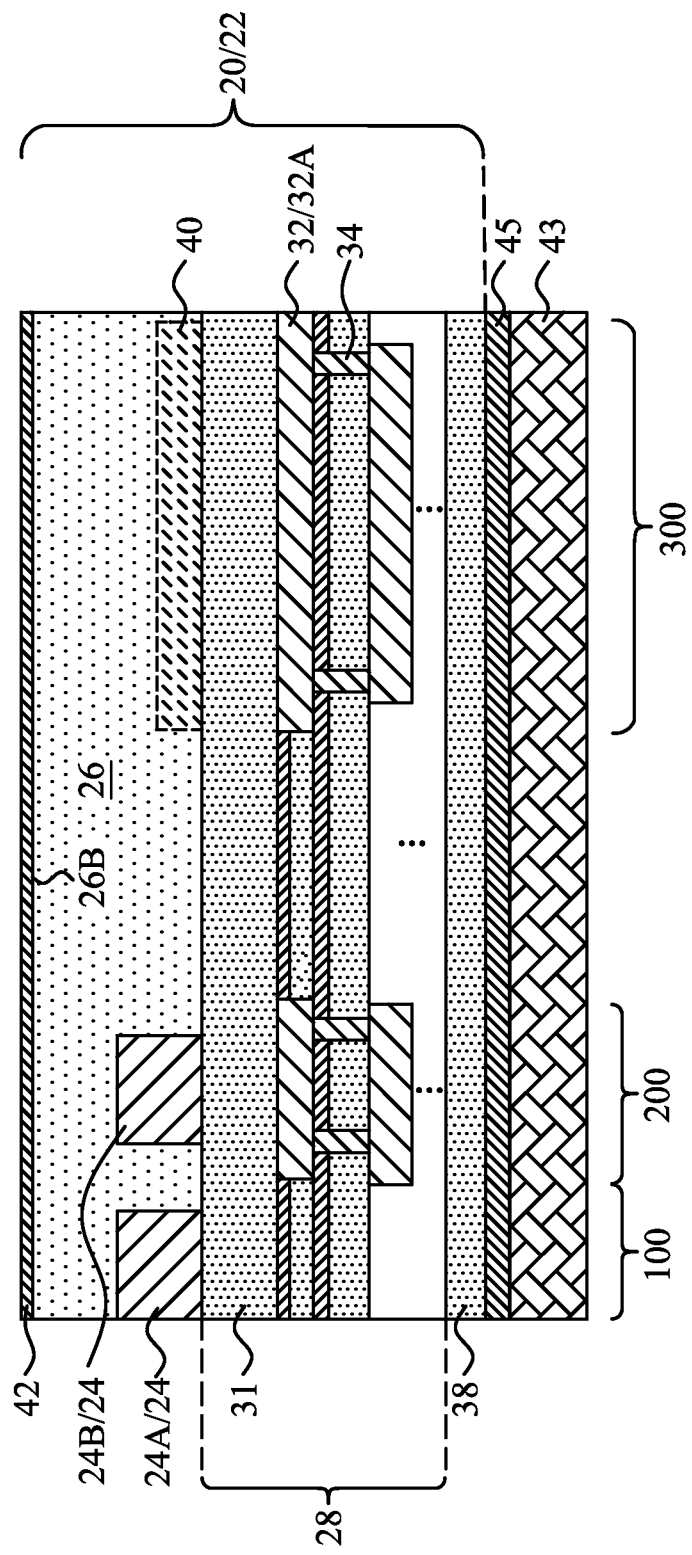

Next, refer to FIG. 2, wafer 22 is flipped over, and the front side of wafer 22 is attached to a carrier 43 through adhesive 45. Accordingly, the top surfaces of each of the features as in FIG. 1 become bottom surfaces in FIG. 2, and vice versa. After the flipping, semiconductor substrate 26 faces up. A backside grinding is then performed to thin semiconductor substrate 26, until the thickness of wafer 22 is smaller than about 30 μm, or smaller than about 5 μm, for example. Back surface 26B of the resulting semiconductor substrate 26 is marked. With semiconductor substrate 26 having a small thickness, light can penetrate from back surface 26B into semiconductor substrate 26 to reach image sensor 24A.

Figure 3:
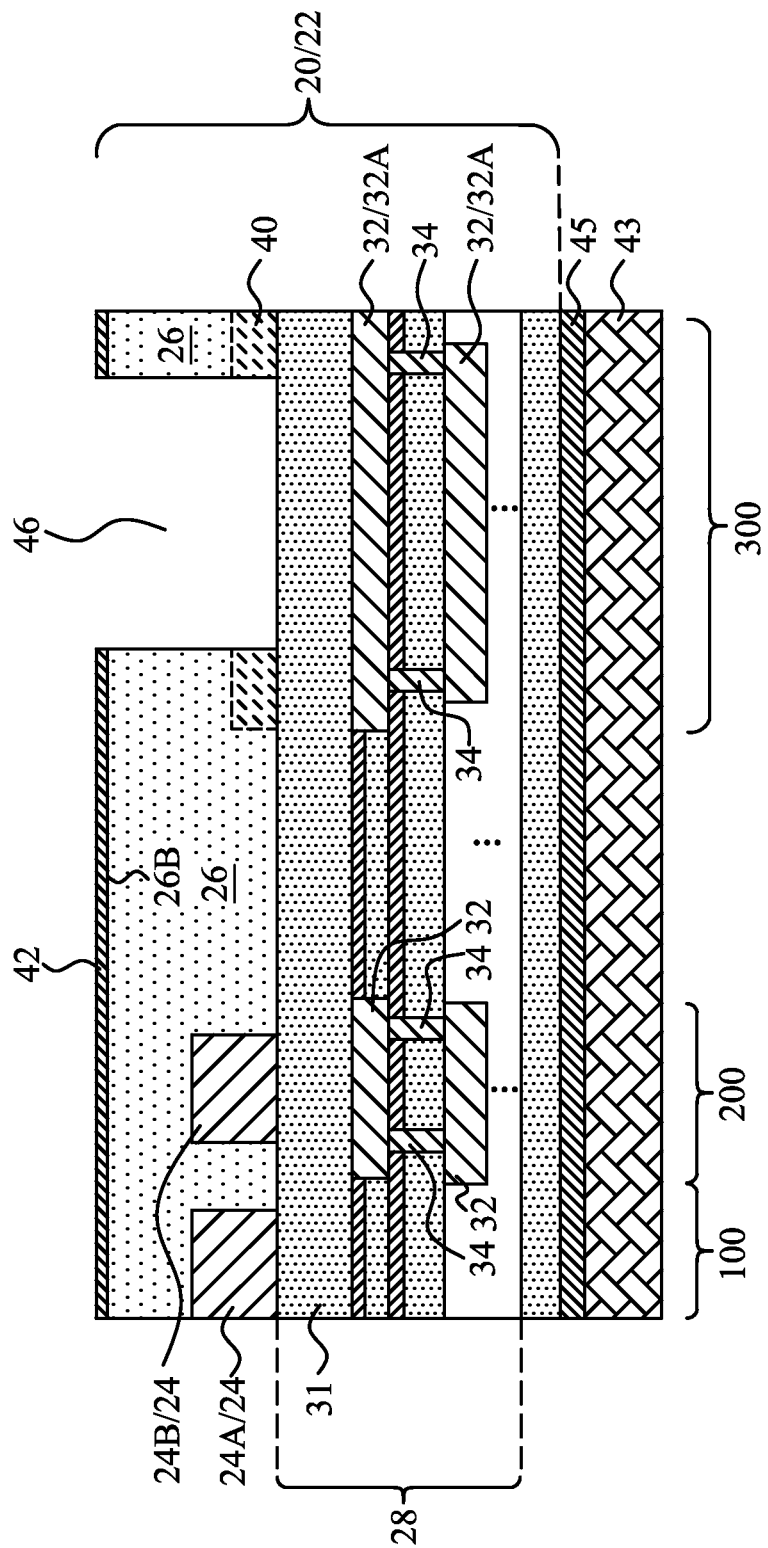

After the step of thinning, Bottom Anti-Reflective Coating (BARC) 42 is formed on back surface 26B of semiconductor substrate 26. In some embodiments, BARC 42 comprises silicon oxynitride (SiON), although other materials may be used. BARC 42 is then used to etch semiconductor substrate 26, so that opening 46 is formed, as shown in FIG. 3. In the etch step, BARC 42 is used as to reduce the effect of the reflection from semiconductor substrate 26. In the embodiments in which STI region 40 is in metal pad region 300, the resulting opening 46 penetrates through STI region 40, with the remaining portion of STI region 40 encircling opening 46. After the etching of semiconductor substrate 26 and STI region 40, the etching is continued to etch dielectric layers such as ILD 31, until metal pad 32A is reached, as shown in FIG. 4.

Figure 4:
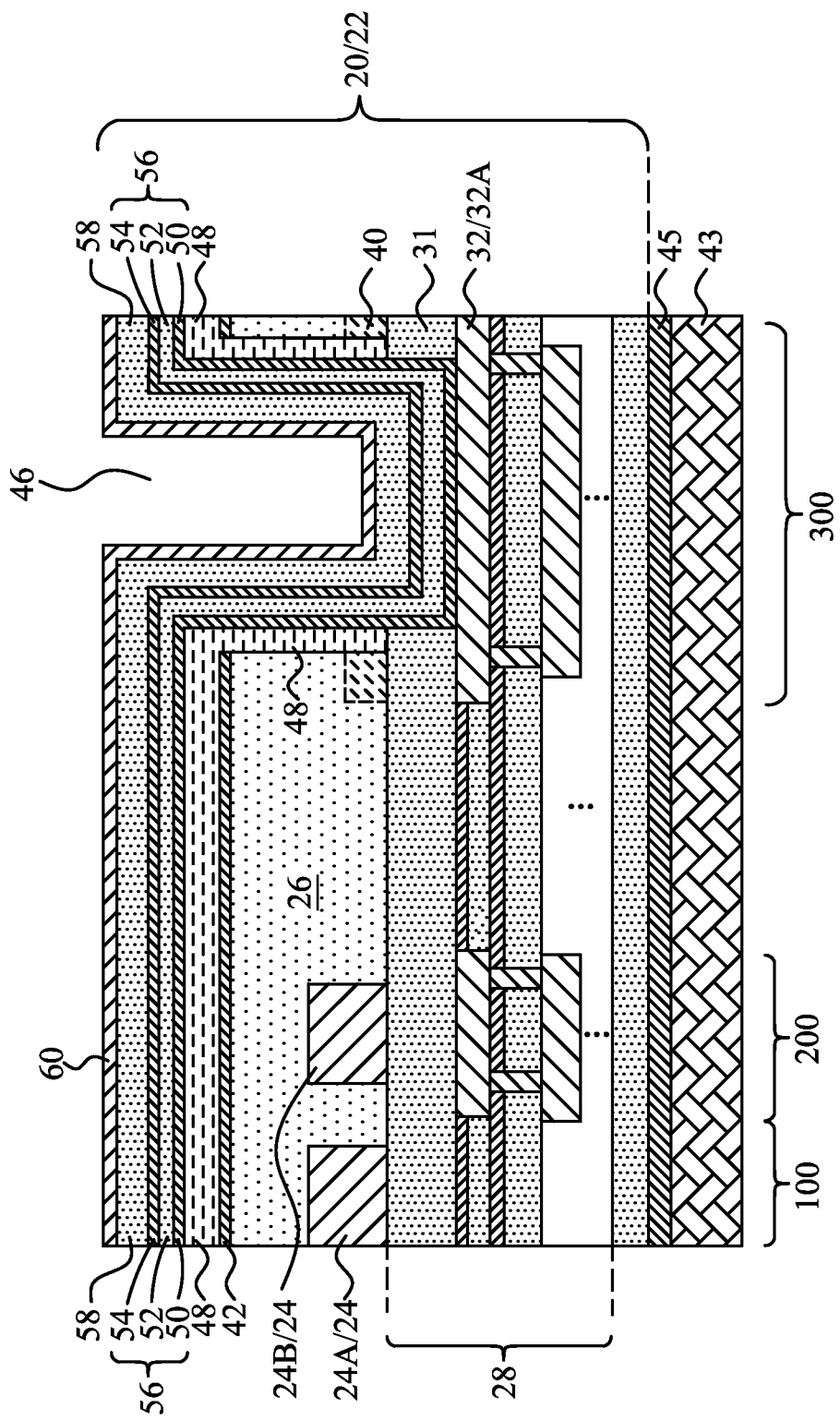

FIG. 4 also illustrates the formation and the patterning of buffer oxide layer 48. Buffer oxide layer 48 may be formed of silicon oxide, for example, although other dielectric materials may be used. The thickness of buffer oxide layer 48 may be between about 500 Å and about 5,000 Å. After the patterning of buffer oxide layer 48, a portion of buffer oxide layer 48 at the bottom of opening 46 is removed, and the sidewall portions of buffer oxide layer 48 remain on the sidewall of opening 46.

FIG. 4 also illustrates the formation of a first conductive layer 56, and second conductive layer 58 over first conductive layer 56. First conductive layer 56 and second conductive layer 58 have an etching selectivity high enough, so that in the subsequent patterning of conductive layer 58, conductive layer 56 may be used as an etch stop layer. In some exemplary embodiments, conductive layer 56 includes barrier/adhesion layer 50, metal-containing layer 52 over barrier/adhesion layer 50, and conductive etch stop layer 54 over metal-containing layer 52. Metal-containing layer 52 may comprise tungsten, tungsten alloys, aluminum, copper, aluminum copper (AlCu), or the like. In these embodiments, etch stop layer 54 has an adequate etch selectivity, and is used to stop the etching of conductive layer 58. In some exemplary embodiments, barrier/adhesion layer 50 comprises titanium, titanium nitride, tantalum, tantalum nitride, or multilayers thereof. Conductive etch stop layer 54 may comprise titanium, titanium nitride, tantalum, tantalum nitride, aluminum, copper, nickel, tungsten, and/or other metallic material(s) having enough etching selectivity with conductive layer 58. The thickness of barrier/adhesion layer 50 may be between about 100 Å and about 1,000 Å. The thickness of metal-containing layer 52 may be between about 1 KÅ and about 6 KÅ. The thickness of conductive etch stop layer 54 may be between about 100 Å and about 1,000 Å. It is appreciated that the dimensions recited throughout the description are merely examples, and may be changed to different values.

In the illustrative embodiments as shown in FIG. 4, conductive layer 56 includes three layers. In alternative embodiments, conductive layer 56 is a single layer, a dual layer, or may include more than three layers. For example, conductive layer 56 may be a single layer that is formed of a material selected from titanium, titanium nitride, tantalum, tantalum nitride, or the like. The single layer may have its bottom surface contacting metal pad 32A, and its top surface contacting conductive layer 58. In these embodiments, the single layer may have a thickness close to the total thickness of the exemplary layers 50, 52, and 54. Alternatively, conductive layer 56 may include a bottom layer formed of titanium, titanium nitride, tantalum, tantalum nitride, or the like, and an upper layer formed of a material that is selected from the same candidate materials of conductive etch stop layer 54. In these embodiments, the bottom layer may have a thickness equal to the total thickness of layer 50 and 52, or alternatively, the bottom layer and the top layer may have thicknesses close to each other, with the total thickness of the bottom layer and the top layer close to the total thickness of layers 50, 52, and 54.

Conductive layer 58 may be formed of AlCu, although other metallic materials and alloys may be used. The thickness of conductive layer 58 may be between about 3 KÅ and about 15 KÅ, for example. After the formation of conductive layer 58, BARC layer 60 is formed, which may comprise SiON, for example.

Figure 5:
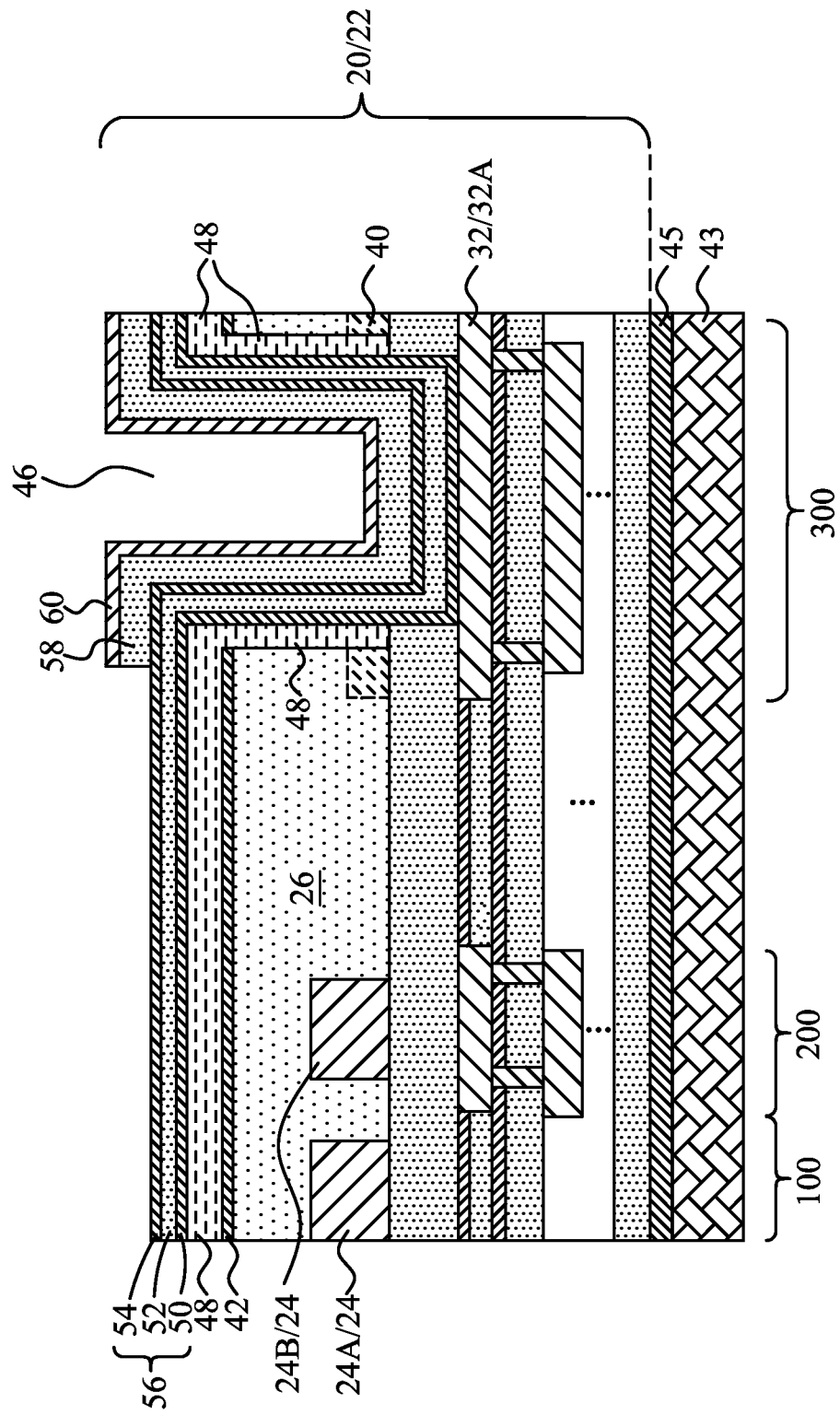

Next, referring to FIG. 5, a patterning step is performed to remove the portions of conductive layer 58 from active image sensor pixel region 100 and region 200. The portion of conductive layer 58 in metal pad region 300 remains. In the patterning step, conductive layer 56 (for example, etch stop layer 54 in conductive layer 56) is used as the etch stop layer, and conductive layer 56 (including etch stop layer 54) is not etched, although a slight over etch may cause the thinning of etch stop layer 54.

Figure 6:
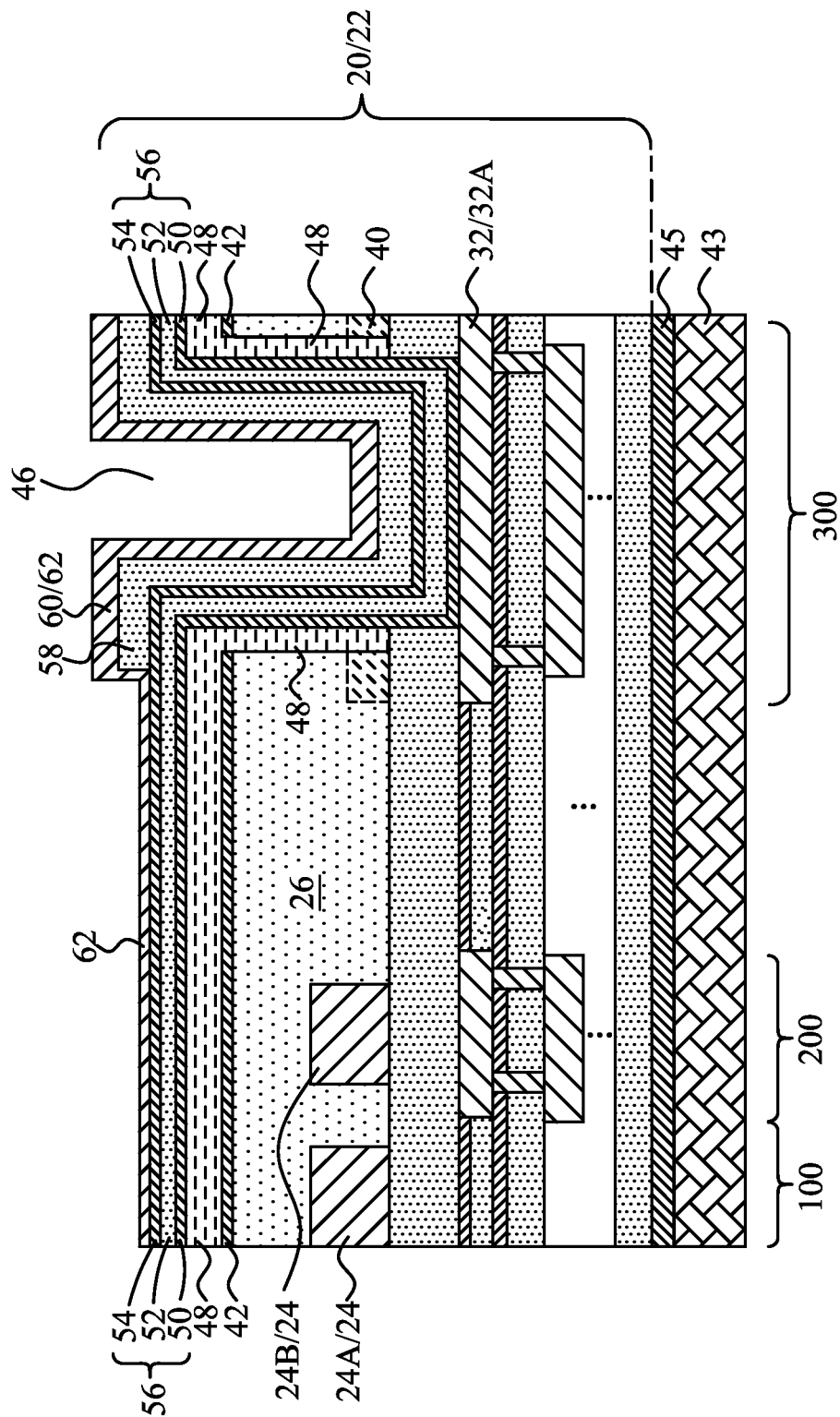

Referring to FIG. 6, an additional BARC layer 62 is formed. In device regions 100 and 200, BARC layer 62 is formed on conductive layer 54. In device region 300, BARC layer 62 is formed on the remaining portion of BARC layer 60, and the resulting combined BARC layer in device region 300 is referred to as BARC layer 60/62 hereinafter.

Figure 7:
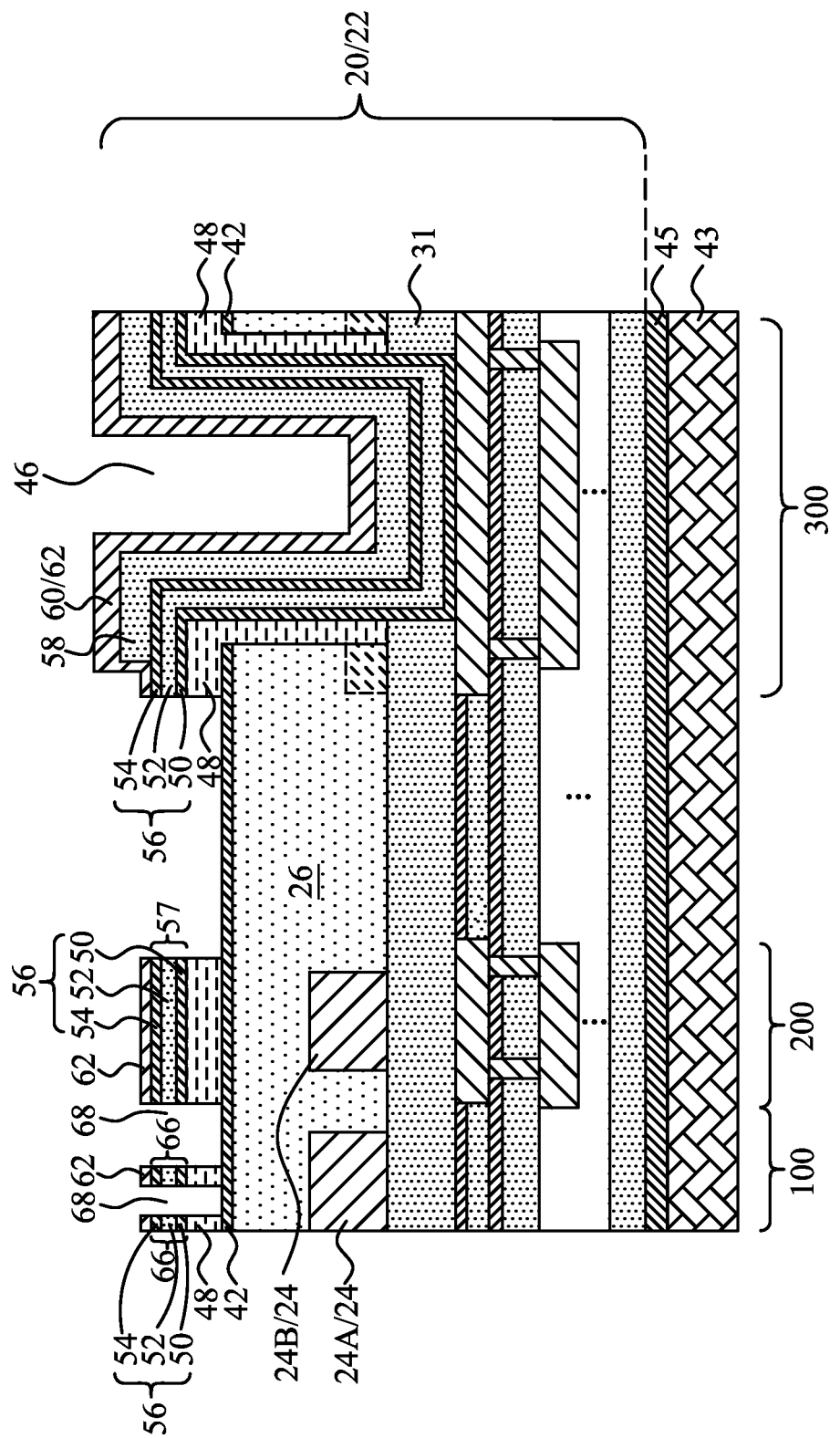

FIG. 7 illustrates the further patterning of conductive layer 56, in which BARC layer 62 is used to reduce the effect of the reflection from conductive layer 56. The etch may be performed until buffer oxide layer 48 or BARC layer 42 is exposed. In the patterning step, region 200 and metal pad region 300 are protected from etching, and the layers therein are not etched. The remaining portion of conductive layer 56 in device region 200 is used as a metal shield (referred to as metal shield 57 hereinafter). Metal shield 57 is used to block the light that otherwise will be received by black reference image sensors 24B. In some embodiments, some portions of conductive layer 56 in active image sensor pixel region 100 are left to form metal grid 66. The portions of conductive layer 56 between metal grid 66 are etched to form openings 68. Active image sensors 24A are aligned to the openings 68 between metal grid 66. In alternative embodiments, the entirety of conductive layer 56 in device region 100 is removed.

Figure 8:
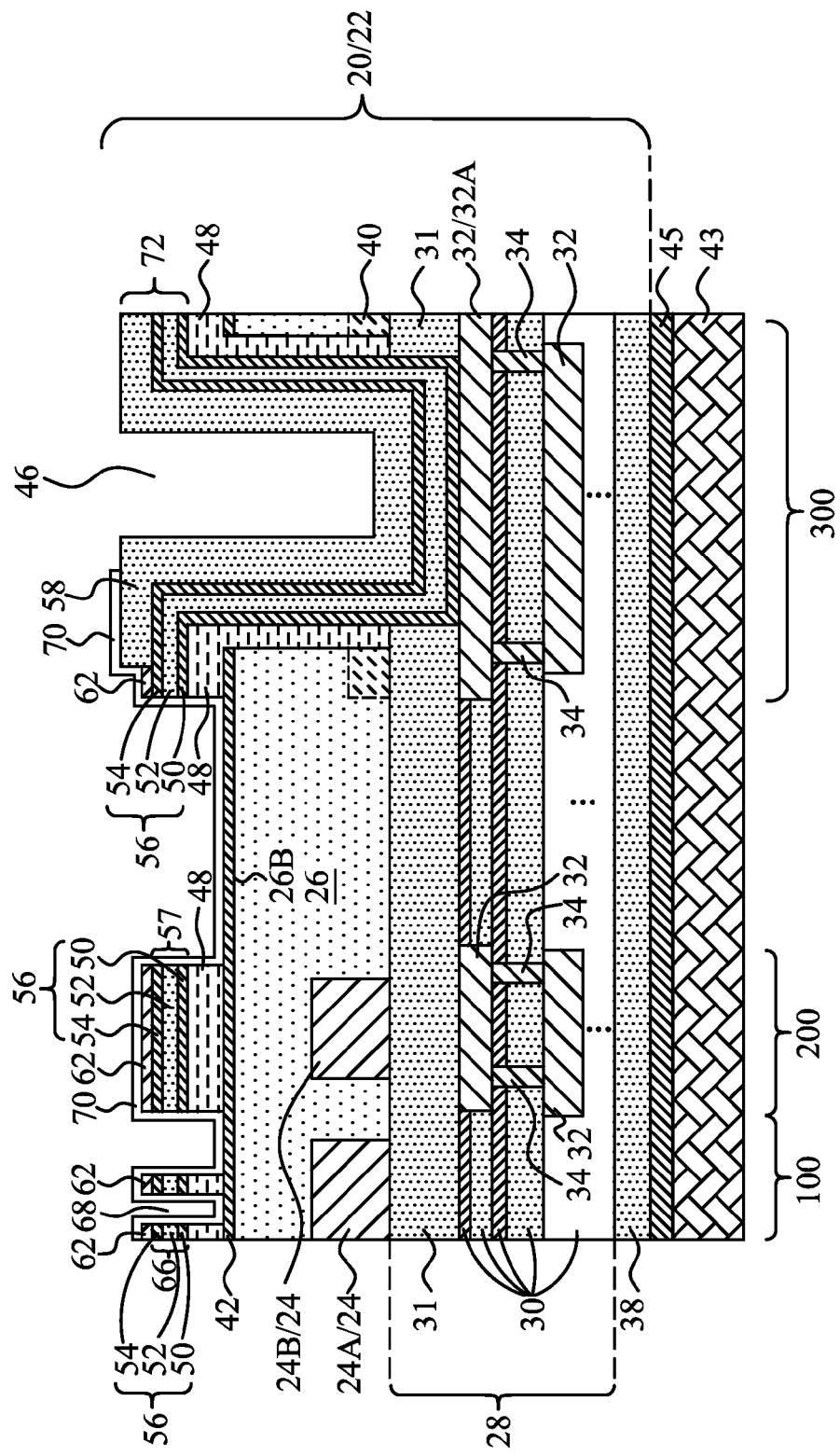

FIG. 8 illustrates the formation of passivation layer 70. In some embodiments, passivation layer 70 includes a silicon oxide layer and a silicon nitride layer over the silicon oxide layer, for example, although other materials may be used. Passivation layer 70 is patterned, and the remaining portion of passivation layer 70 protects device regions 100 and 200, and is removed from device region 300, so that conductive layer 58 is exposed. Furthermore, some portions of BARC layers 60 and 62 are also removed from device region 300. In device region 300, the portion of conductive layer 58 and 56 therein in combination act as backside metal pad 72, which is electrically connected to metal pad 32A. Backside metal pad 72 may be used for bonding BSI chip 20 to other devices or chips, or may be used for probing in the testing of chip 20.

In subsequent processes, remaining components of BSI chip 20, including color filters (not shown), micro-lenses (not shown), and the like, are formed. Each of the color filters and the micro-lenses may be aligned to one of active image sensors 24A. Active image sensors 24A may thus receive the filtered light.

In the embodiments, conductive layer 58 is deposited before patterning the underlying metal layer 56. The portions of conductive layer 58 in device region 200 are then removed from device regions 100 and 200. In the formation and the patterning of conductive layer 58, since conductive layer 56 has not been patterned yet, image sensors 24 are protected by conductive layer 56 from damage, which damage is caused by the plasma used in the deposition and the etching of conductive layer 58. Furthermore, since buffer oxide layer 48 is not exposed in the patterning of conductive layer 58, and is etched at most once when conductive layer 56 is patterned, the thickness of buffer oxide layer 48 may be reduced without the concern of being over etched. Reducing the thickness of buffer oxide layer 48 results in the desirable reduction in the step heights caused by buffer oxide layer 48. The reduction in the step height is beneficial for the subsequent formation of micro-lenses and color filters.

FIGS. 9 through 17 illustrate cross-sectional views of intermediate stages in the formation of BSI image sensor chip 20 (and the respective wafer 22) in accordance with alternative embodiments. Unless specified otherwise, the materials and formation methods of the components in these embodiments are essentially the same as the like components, which are denoted by like reference numerals in the embodiments shown in FIGS. 1 through 8. The details regarding the formation process and the materials of the components shown in FIGS. 9 through 17 may thus be found in the discussion of the embodiments shown in FIGS. 1 through 8.

Figure 9:
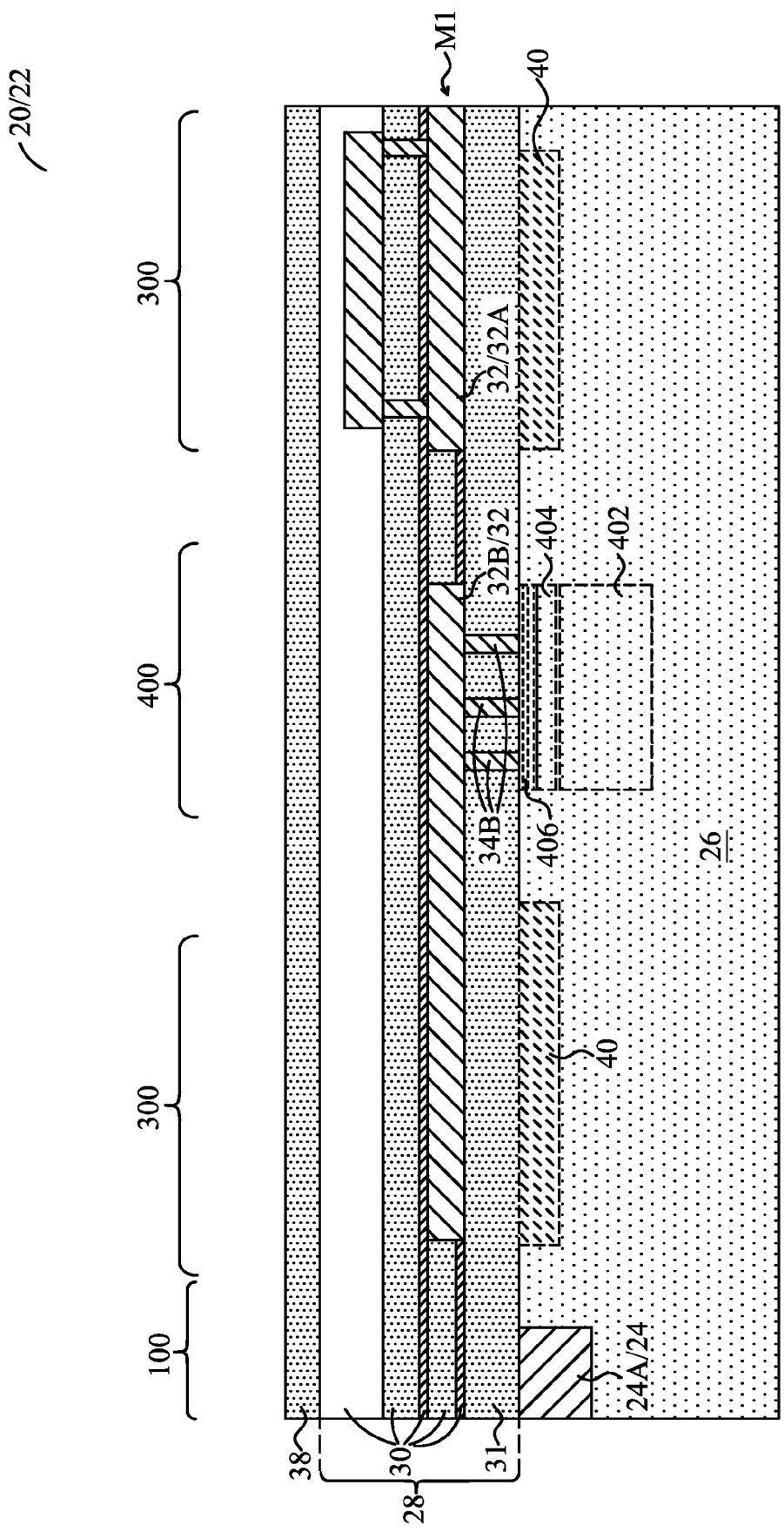
FIGS. 9 through 17 are cross-sectional views of intermediate stages in the manufacturing of an image sensor chip in accordance with some exemplary embodiments.

Referring to FIG. 9, an initial structure of image sensor chip 20, which is a part of wafer 22, is formed. Image sensor chip 20 includes active image sensor pixel region 100, which includes active images sensors 24A therein. Image sensor chip 20 also includes metal pad regions 300 and substrate-connecting region 400. Although not shown in FIG. 9, image sensor chip 20 also includes a black reference circuit including black reference image sensors therein, as shown as 428 in FIGS. 19 and 20. The black reference image sensors may be essentially the same as 24B in FIG. 8.

P-well region 402 and p+ region 404 are formed in substrate 26 and in substrate-connecting region 400. P-well region 402 and p+ region 404 may be in contact with each other. In some embodiments, p-well region 402 has a p-type impurity concentration between about $10^{14}/cm^3$ and about $10^{17}/cm^3$, and p+ region 404 has a p-type impurity concentration between about $10^{19}/cm^3$ and about $10^{21}/cm^3$. Silicide region 406 is formed at a surface of p+ region 404. Contact plugs 34B are formed in ILD 31, and are connected to silicide region 406. Metal line 32B, which may include a metal pad portion, is formed to connect to contact plugs 34B. Metal line 32B is hence electrically coupled to p-well region 402. Metal line 32B may be in metal layer M1, although it may also be in other metal layers.

Figure 10:
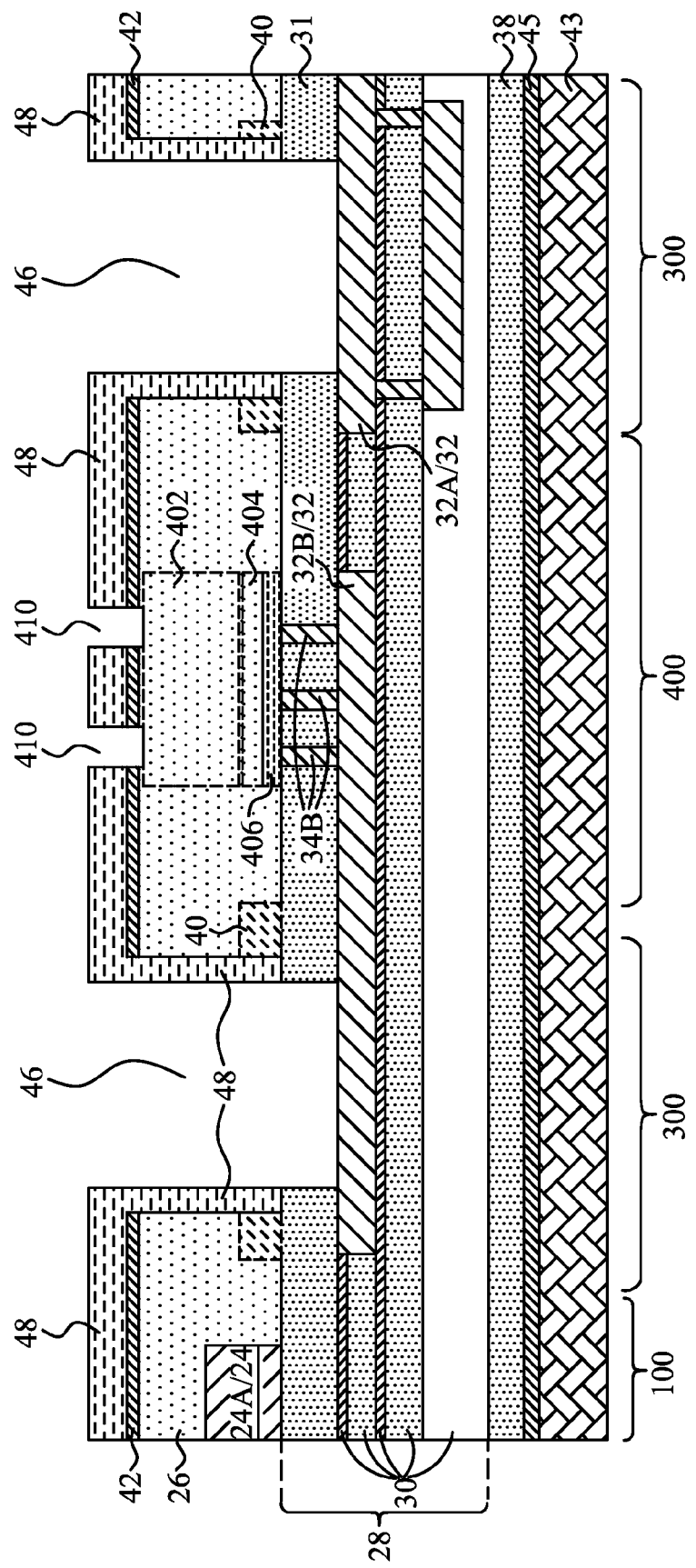

Next, referring to FIG. 10, image sensor chip 20 is flipped over, and is attached to carrier 43 through adhesive 45. A backside grinding is then performed on the backside of semiconductor substrate 26. After the backside grinding, p-well region 404 is exposed on the backside surface of the remaining portion of substrate 26. Next, BARC layer 42 is formed on the back surface of substrate 26, followed by the patterning of BARC layer 42 and substrate 26. Openings 46 are thus formed in device regions 300. In some embodiments, openings 46 are separated from each other by a portion of substrate 26, in which p-well region 402 and p+ region 404 are formed. Openings 46 penetrate through substrate 26 and STI region 40, and ILD 31 is exposed through openings 46. Next, buffer oxide layer 48 is formed, and extends into openings 46. The sidewalls of the exposed substrate 26 are thus covered by buffer oxide layer 48.

As also shown in FIG. 10, after the formation of buffer oxide layer 48, buffer oxide layer 48 and the underlying BARC layer 42 are patterned, forming openings 410 in device region 400. P-well region 402 is hence exposed to openings 410. The portions of buffer oxide layer 48 at the bottoms of openings 46 are also removed, and hence metal pad 32A and the metal portion of metal line 32B are exposed to openings 46.

Figure 11:
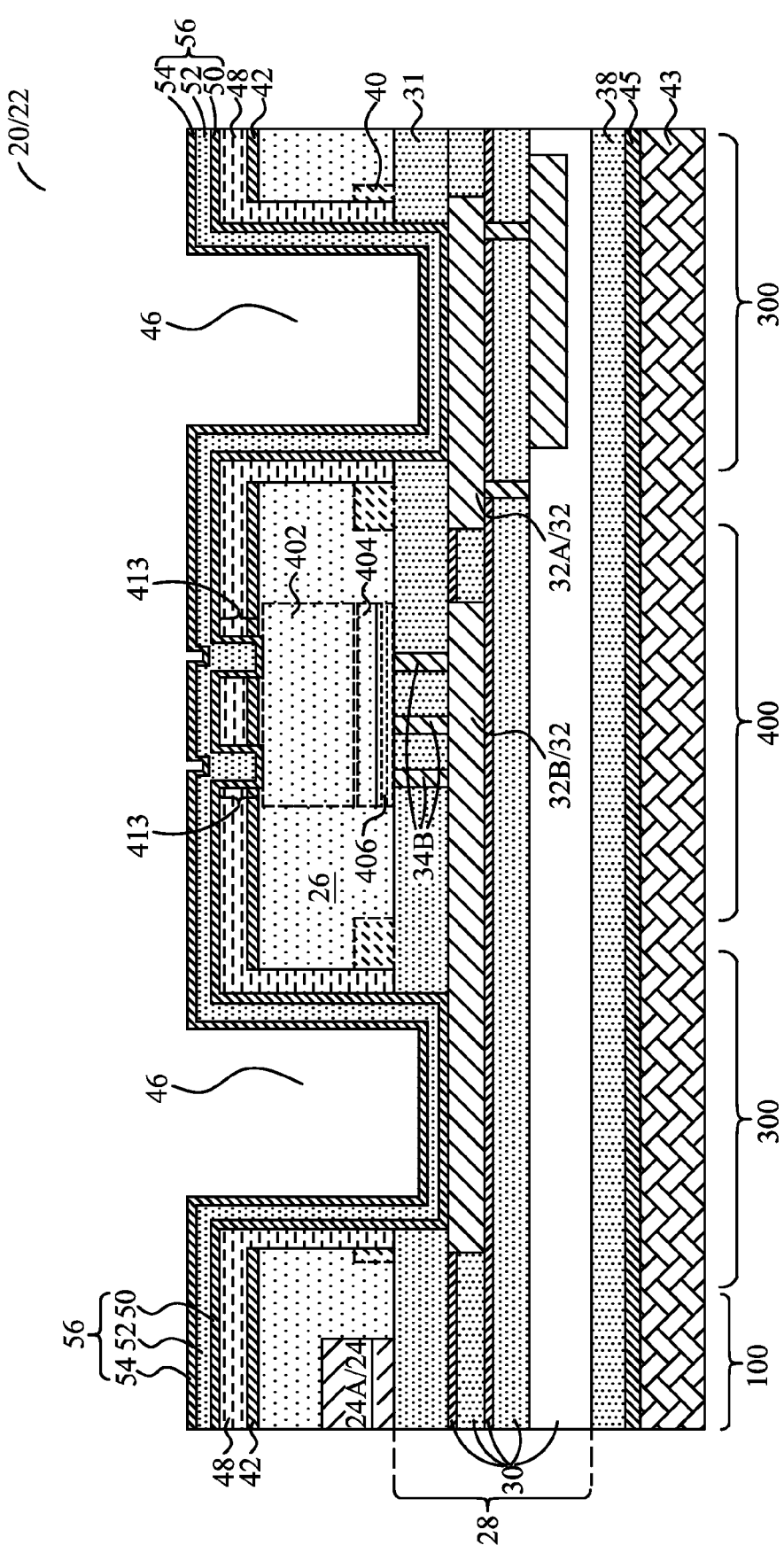
Figure 12:
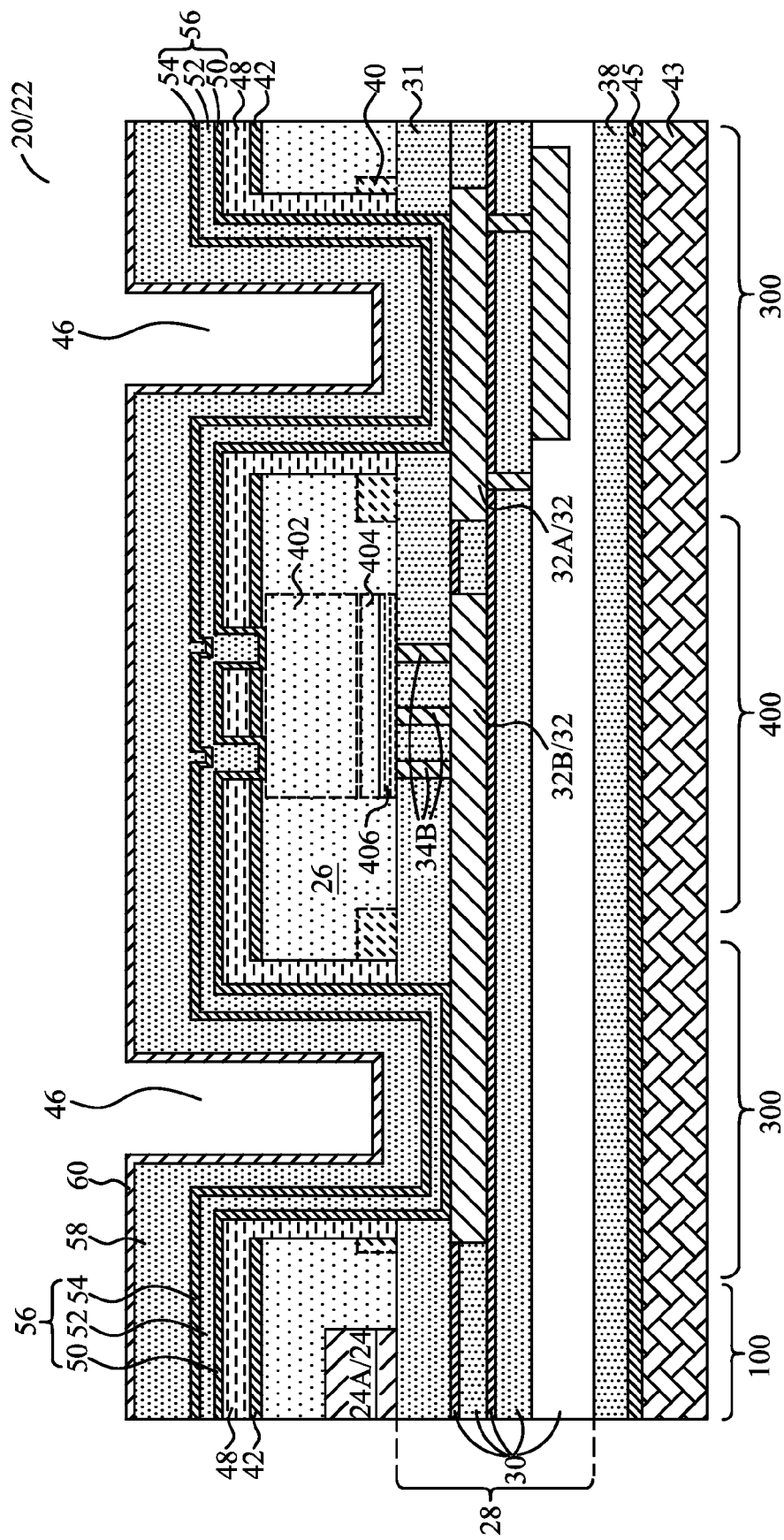

FIG. 11 illustrates the formation of first conductive layer 56. In some embodiments, first conductive layer 56 includes conductive barrier/adhesion layer 50, metal-containing layer 52, and conductive etch stop layer 54. In the embodiments in which metal-containing layer 52 is formed of a material different from the material of the subsequently formed conductive layer 58 (FIG. 12), the formation of etch stop layer 54 may be skipped, and layers 52 and 58 (FIG. 12) may be in contact with each other. Layers 50, 52, and 54 include portions over the top surface of buffer oxide layer 48, and portions extending into openings 46 and 410 (FIG. 10). The portions of first conductive layer 56 extending into openings 410 (FIG. 10) form conductive plugs 413. Barrier/adhesion layer 50 is also in contact with p-well region 402, and hence forms a Schottky contact with p-well region 402. FIG. 12 illustrates the formation of the second conductive layer 58 and BARC layer 60, which also extend into openings 46. Conductive layer 58 and metal-containing layer 52 are thus electrically coupled to each other.

Figure 13:
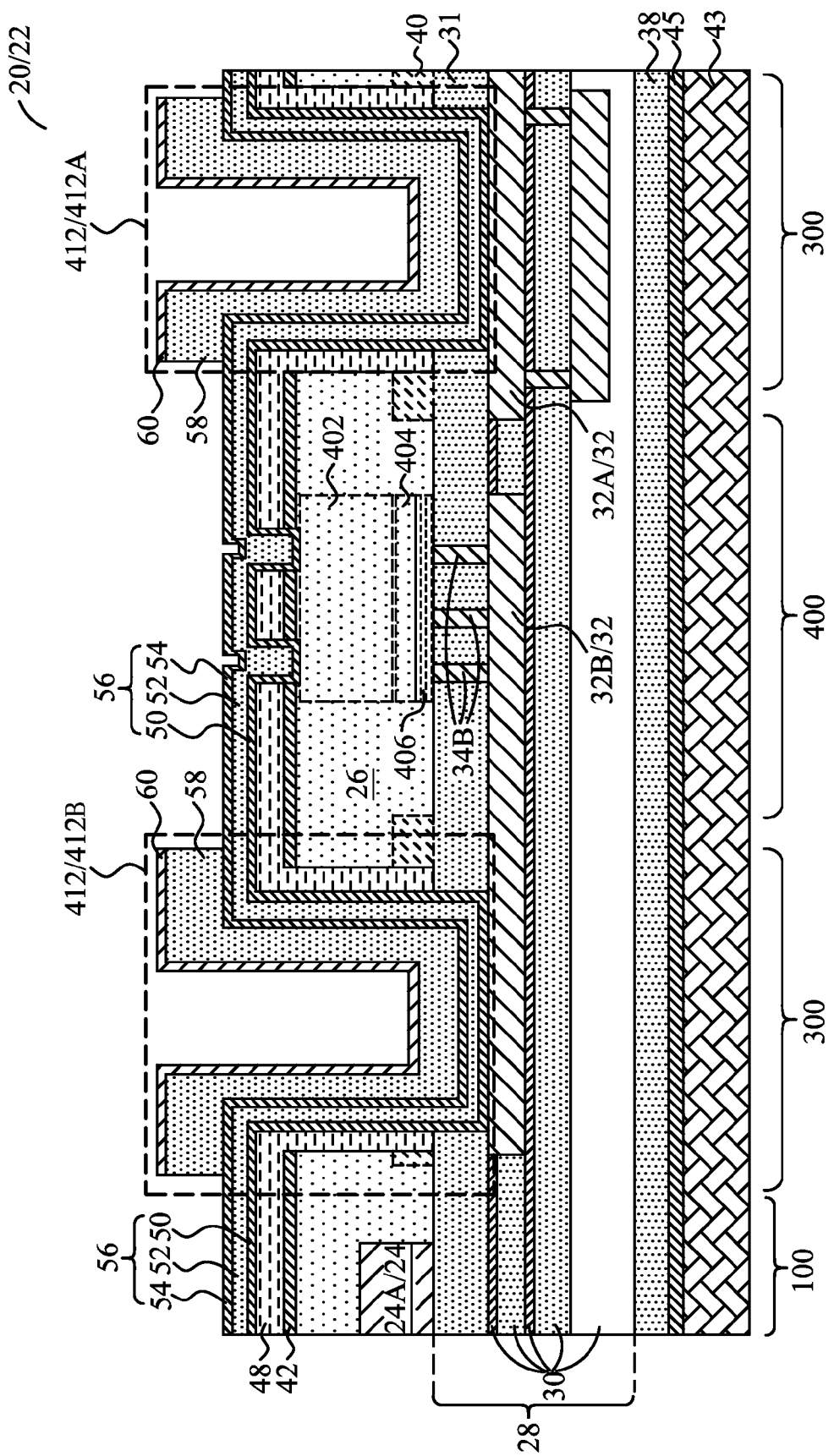

Referring to FIG. 13, conductive layer 58 and BARC layer 60 are patterned, wherein BARC layer 60 is used to reduce the reflection in the exposure of the respective photo resist (not shown). As a result of the patterning, conductive layer 58 and BARC layer 60 are removed from device regions 100 and 400. Metal pads 412 (include 412A and 412B) are thus formed. Each of metal pads 412A and 412B includes a portion of first conductive layer 56 and a portion of second conductive layer 58.

Figure 14:
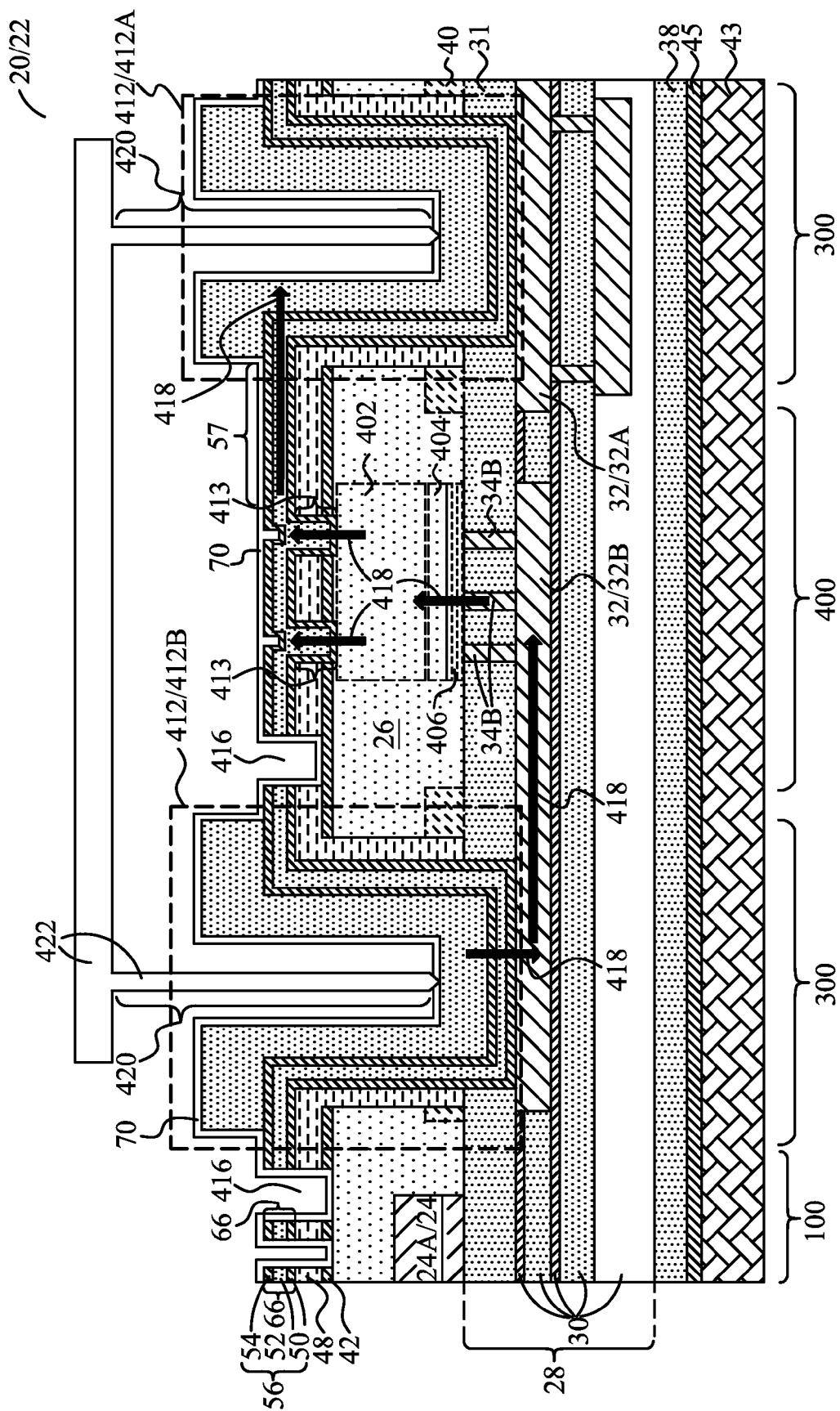
Figure 18:
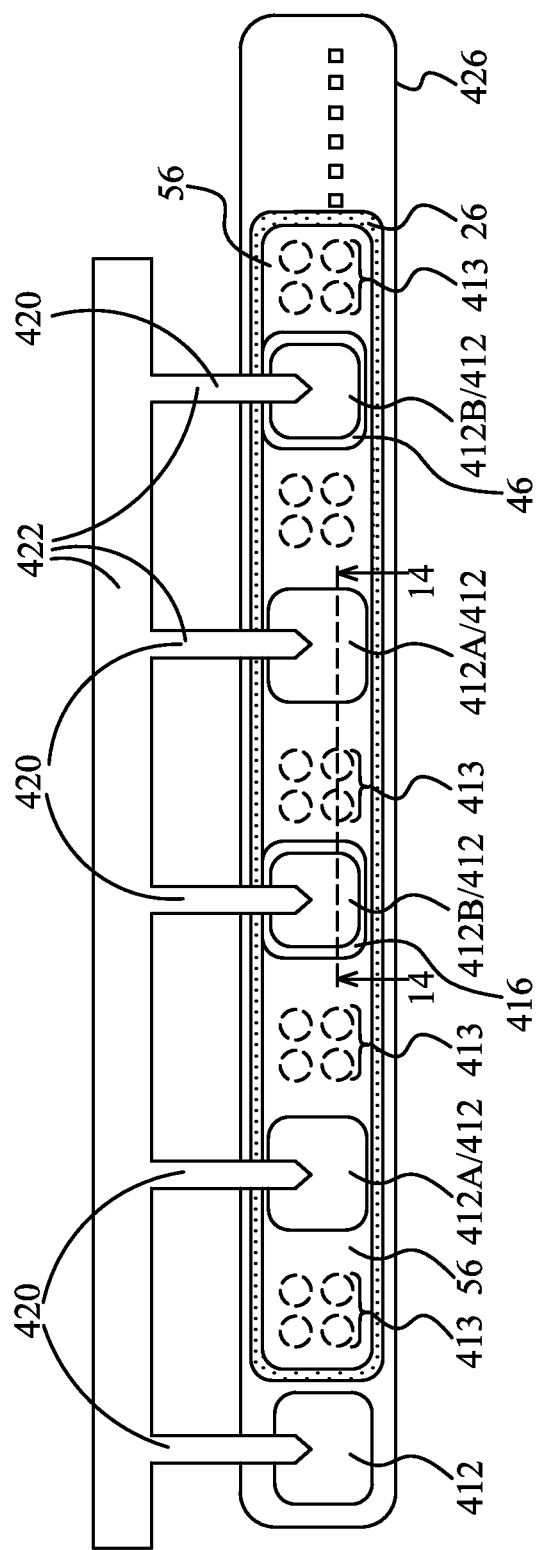
FIG. 18 illustrates a top view of a test structure in accordance with some embodiments.

FIG. 14 illustrates the further patterning of first conductive layer 56. In the patterning step, a portion of first conductive layer 56 that interconnects metal pads 412A and 412B is etched, forming opening 416 in first conductive layer 56. Opening 416 may also form a full ring encircle metal pad 412B (as shown in FIG. 18). Hence, metal pads 412A and 412B are no longer electrically connected through first conductive layer 56 directly. Metal pads 412A and 412B, however, remain to be electrically coupled through the electrical path shown by arrows 418. Metal pads 412A and 412B may thus be used to probe the Schottky contacts between conductive plugs 413 and p-well region 402. The probing may be performed in real-time during the manufacturing process of image sensor chip 20. As shown in FIG. 14, when probe pins 420 of probe card 422 are put to contact with metal pads 412A and 412B, the I-V curve of the Schottky contacts may be measured through probe pins 420.

FIG. 18 illustrates a top view of an exemplary test structure 424, which includes a plurality of metal pads 412A and 412B allocated in an alternating layout. Test structure 424 may be formed in image sensor chip 20, or in the scribe lines in the respective wafer 22. The cross-sectional view in FIG. 14 may be obtained from the plane crossing line 14-14 in FIG. 18. As shown in FIG. 18, each of metal pads 412A is electrically coupled to neighboring metal pads 412B through contact plugs 413. Hence, the plurality of metal pads 412A and 412B are electrically coupled serially to form a daisy chain. Metal pads 412A and 412B are aligned to a straight line, so that the probe pins 420 of probe card 422 may contact metal pads 412. In FIG. 18, substrate 26 and first conductive layer 56 are illustrated to show that metal pads 412 are formed to extend into the openings in substrate 26. FIG. 18 also illustrates that first conductive layer 56 electrically interconnects metal pad 412A to contact plugs 413, and openings 416 (also refer to FIG. 14) encircle metal pads 412B, so that the electrical connection between metal pad 412B and the neighboring metal pad 412A is forced to go through conductive plugs 413.

It is appreciated that although test structure 424 is discussed along with BSI image sensor chip 20, test structure 424 may be formed in any other type of chips other than the image sensor chips.

Referring back to FIG. 14, the patterning of first conductive layer 56 also results in the formation of metal grid 66 and metal shield 57. It is noted that the position of metal shield 57 is schematic, and metal shield 57 may be located in different positions of image sensor chip 20 rather than between metal pad 412 and conductive plug 413. Exemplary positions of metal shield 57 may be found in FIGS. 19 and 20. Also, although the devices shielded by metal shield 57 is not shown in FIG. 14, the shielded devices may include black reference circuit 428 (FIGS. 19 and 20), peripheral circuits 430, and the like.

Figure 15:
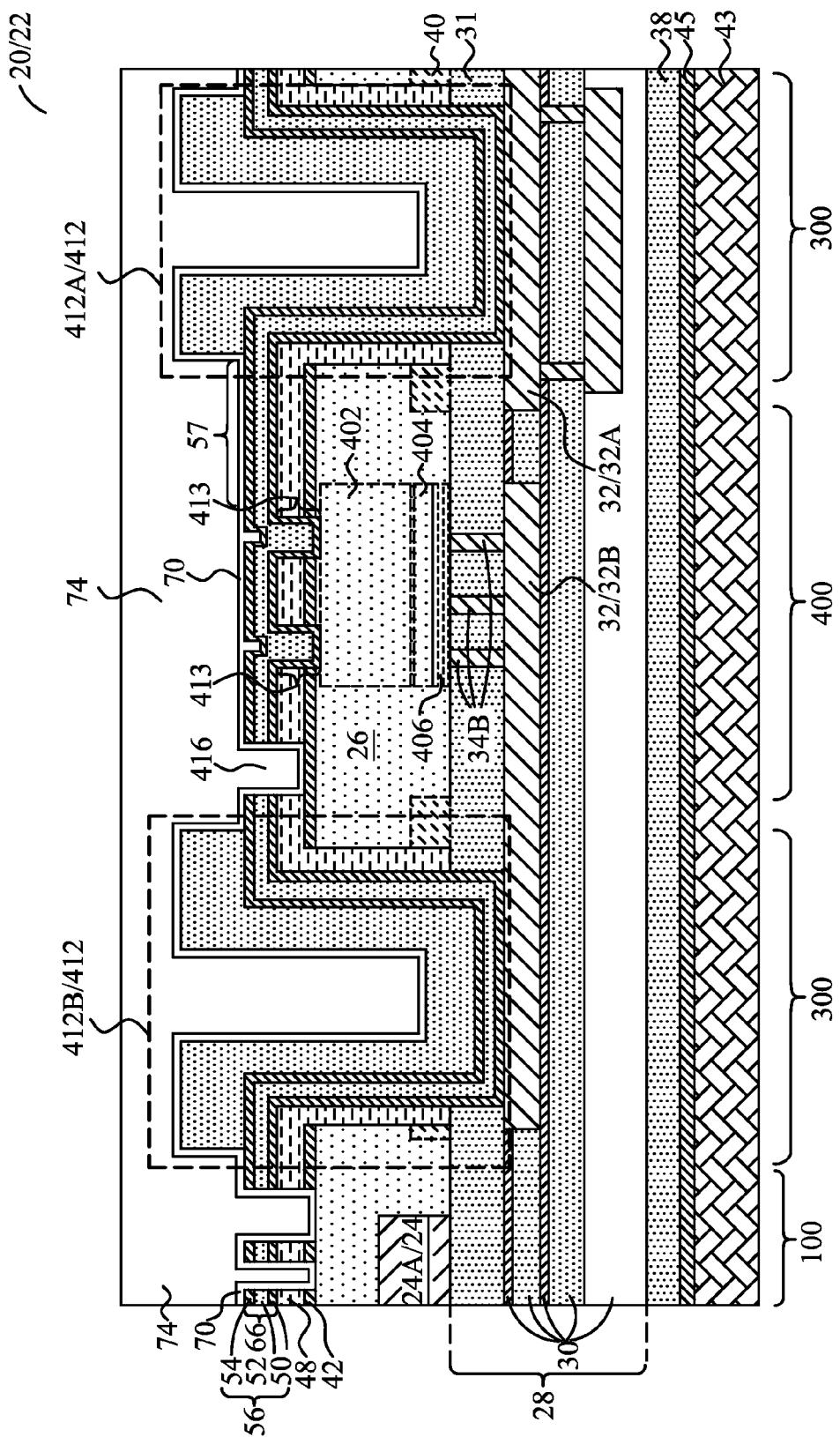

Referring again to FIG. 14, after the probing of metal pads 412, passivation layer 70 may be formed to cover the exposed conductive layers 56 and 58. Next, dielectric layer 74 is formed, as shown in FIG. 15. Dielectric layer 74 may be an oxide layer, and hence is referred to as oxide layer 74 hereinafter. In some embodiments, oxide layer 74 is a silicon oxide layer formed using Plasma Enhanced Chemical Vapor Deposition (PECVD), Atomic Layer Deposition (ALD), or the like. A planarization step such as a Chemical Mechanical Polish (CMP) is performed to level the top surface of oxide layer 74. Oxide layer 74 fully fills the concaved portions of image sensor chip 20, and hence the top surface of oxide layer 74 throughout the entire wafer 22 is leveled. Oxide layer 74 also includes a portion in device region 400, which portion is overlying and contacting first conductive layer 56.

Figure 16:
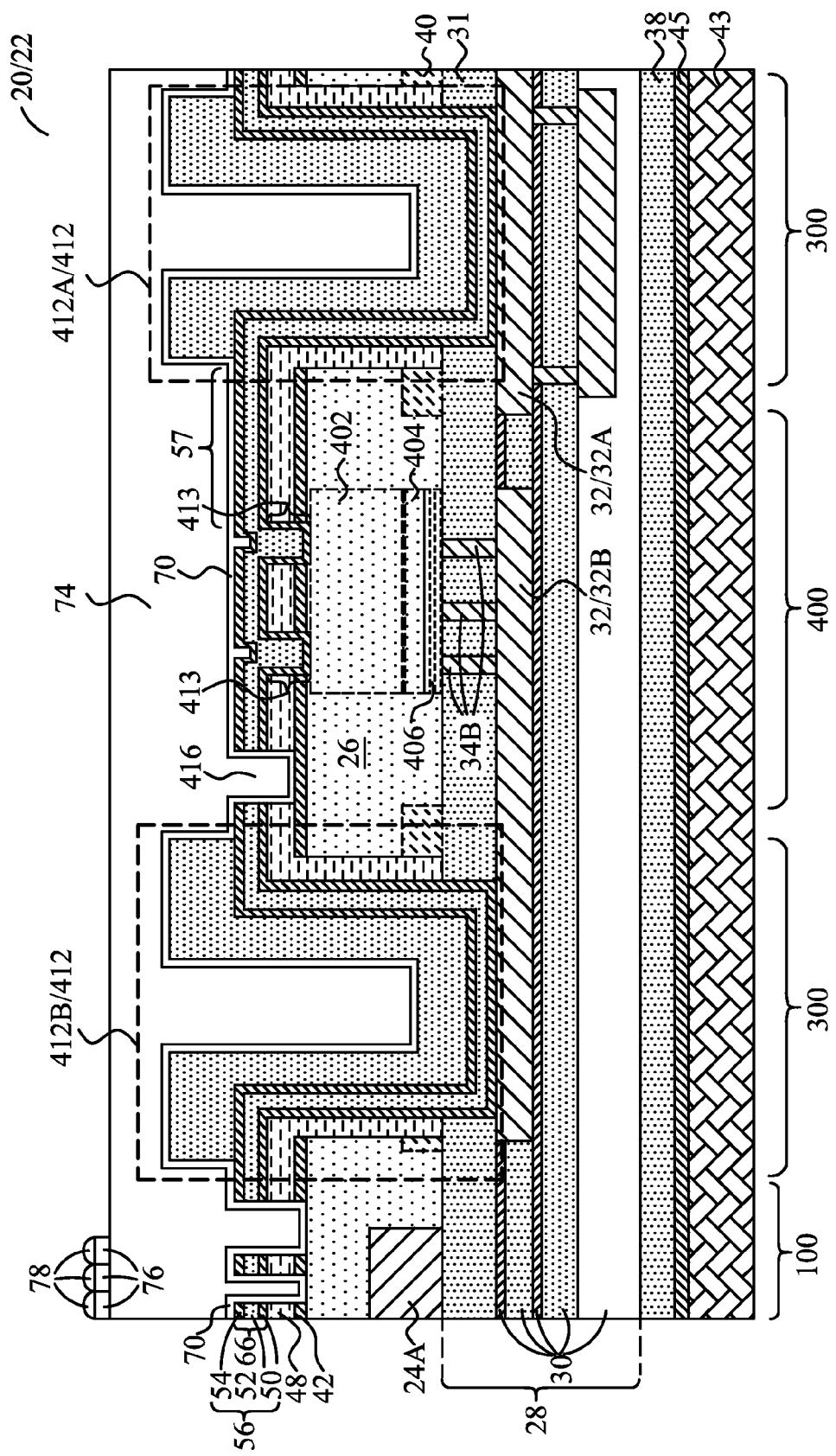

In subsequent process steps, as shown in FIG. 16, color filters 76 and micro-lenses 78 are formed, with active image sensors 24A aligned to color filters 76 and micro-lenses 78. Active image sensors 24A may thus receive the light the passes through filters 76 and micro-lenses 78. In these embodiments, the entire top surface of wafer 22 is flat, and hence the formation of color filters 76 and micro-lenses 78 incurs less process difficulty. For example, the formation of color filters 76 includes forming and patterning polymers that may filter light. Since the polymers are formed on the flat surface of oxide layer 74, the thicknesses of the polymers are uniform, and hence the removal of the polymers is easy.

Figure 17:
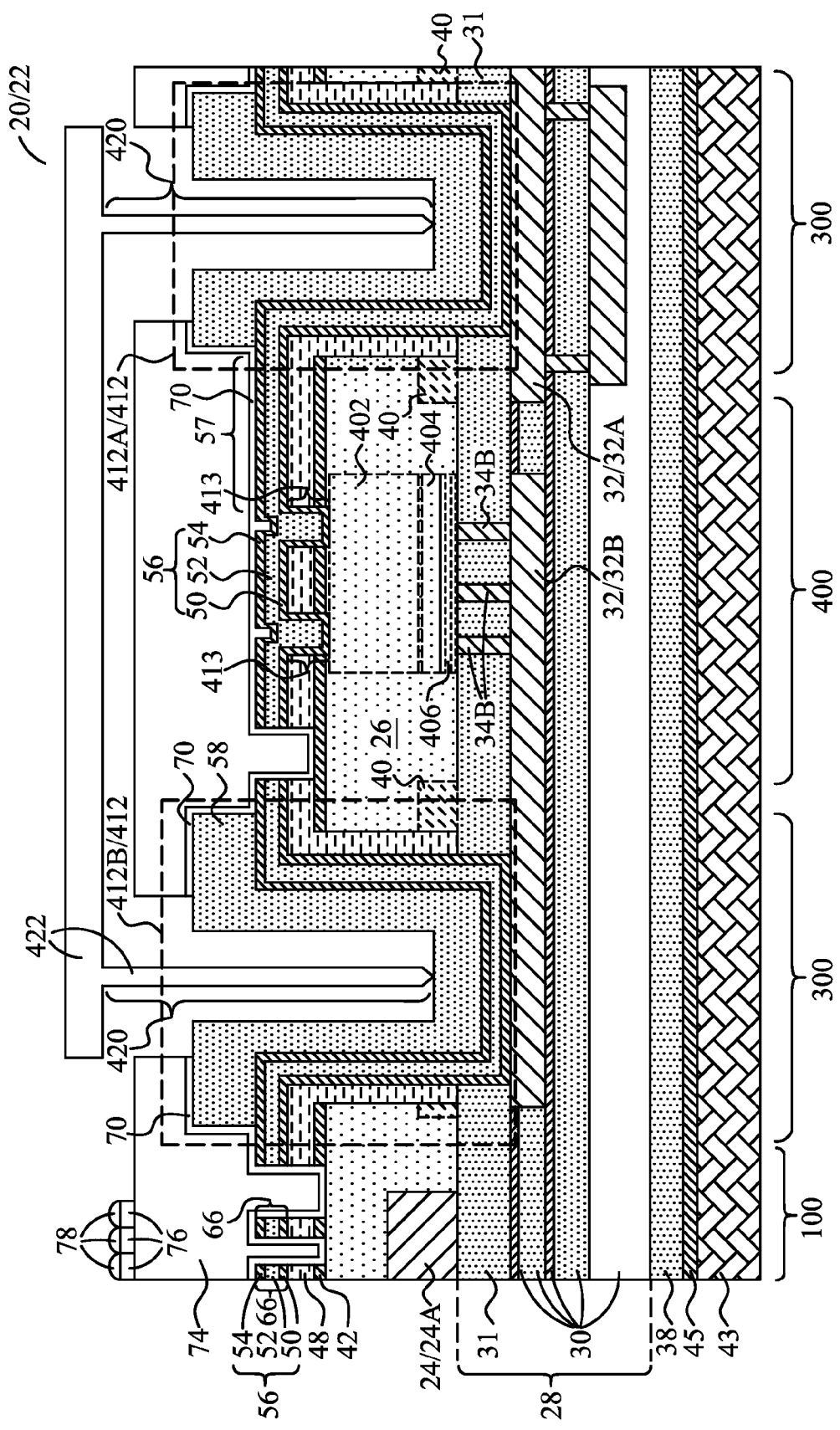

After the formation of color filters 76 and micro-lenses 78, as shown in FIG. 17, oxide layer 74 is patterned. The portions of oxide layer 74 overlapping metal pads 412A and 412B are removed. Metal pads 412A and 412B are thus exposed. Metal pads 412A and 412B may be used to perform wafer acceptance test, wherein probe pins 420 of probe card 422 is used for the probing of the Schottky contact between conductive plugs 413 and p-well region 402.

Figure 19:
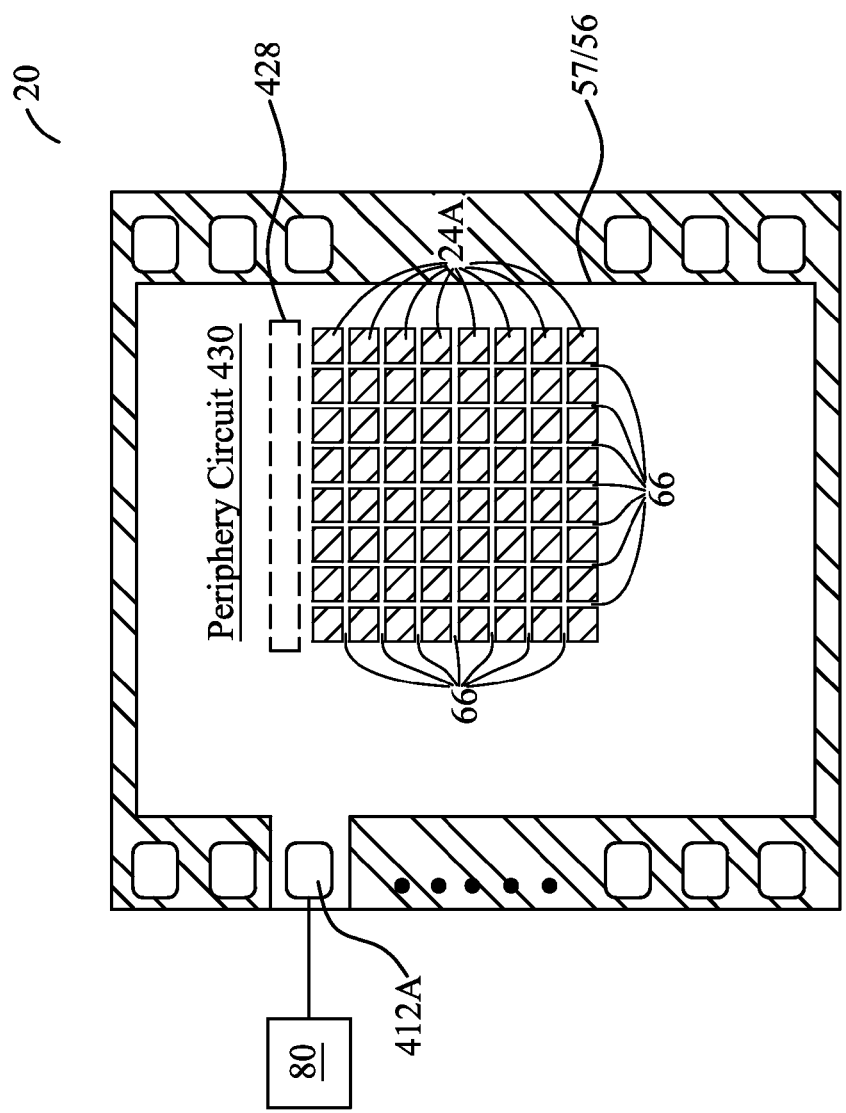
FIG. 19 illustrates a top view of an image sensor chip in accordance with some embodiments, wherein a metal pad is connected to a metal shield and a metal grid.
Figure 20:
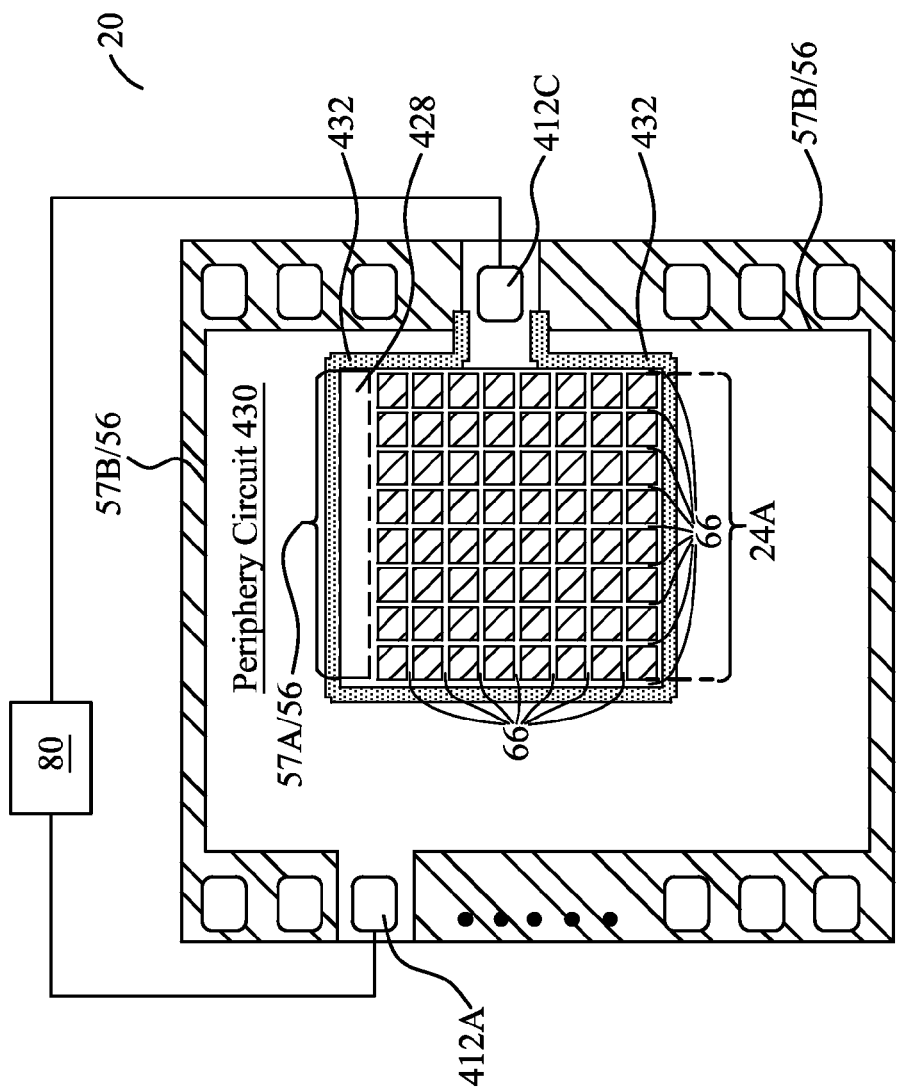
FIG. 20 illustrates a top view of an image sensor chip in accordance with some embodiments, wherein a first metal pad is connected to a metal shield, and a second metal pad is connected to a metal grid.

In the above-discussed embodiments, metal shield 57 is electrically coupled to metal pad 412A. Hence, a bias voltage may be applied to metal shield 57 by applying the bias voltage on metal pad 412A. The respective embodiments are shown in FIGS. 19 and 20. It is appreciated that the embodiments in FIGS. 17 through 20 may co-exist in the same image sensor chip 20.

FIG. 19 illustrates a top view of an exemplary image sensor chip 20 in accordance with some embodiments, in which bias voltages are applied. As shown in FIG. 19, metal shield 57 and metal grid 66 are electrically coupled to metal pad 412A, wherein the connection is made through first conductive layer 56. An image sensor array comprising active image sensors 24A is also illustrated. Metal shield 57 and metal grid 66 are formed of portions of the first conductive layer 56 (FIG. 17), and metal pad 412A includes portions of both first and second conductive layers 56 and 58 (FIG. 17). The formation of the structure shown in FIG. 19 may be found referring the process shown in FIGS. 8 through 17. Metal shield 57 is overlying, and covers, black reference circuit 428, which include black reference image sensors therein. Metal shield 57 also covers periphery circuit 430, which includes the circuit for processing the image signals. Periphery circuit 430 may include, for example, Image Signal Processing (ISP) circuits, which may include Analog-to-Digital Converters (ADCs), Correlated Double Sampling (CDS) circuits, row decoders, and/or the like.

As shown in FIG. 19, metal pad 412A is connected to voltage source 80, which provides a bias voltage to metal shield 57 and metal grid 66. In some embodiments, the bias voltage is 0V, which means that metal shield 57 and metal grid 66 are electrically grounded. Accordingly, the undesirably accumulated holes in metal shield 57 and metal grid 66 may be neutralized and eliminated. In alternative embodiments, voltage source 80 provides a negative bias voltage to metal shield 57 and metal grid 66. The negative bias voltage may be between about −0.01 volts and about −30 volts.

FIG. 20 illustrates a top view of an exemplary image sensor chip 20 in accordance with alternative embodiments. These embodiments are similar to the embodiments in FIG. 19, except that metal grid 66 and the metal shield portion 57A are electrically insulated from metal shield portion 57B. Metal shield portion 57B covers periphery circuit 430. Metal shield portion 57A covers black reference circuit 428. In these embodiments, first conductive layer 56 is etched in the step shown in FIG. 14, so that trench 432 is formed simultaneous with the formation of metal grid 66 and metal shield 57, and simultaneously with the formation of trench 416 in FIG. 14. Trench 432 is later on filled with oxide layer 74 in the step shown in FIG. 16. Metal grid 66 and metal shield portion 57A are electrically coupled to metal pad 412C, which may have essentially the same structure as metal pad 412A. Metal shield portion 57B is electrically coupled to metal pad 412A, and is electrically decoupled from metal pad 412C. Metal pads 412A and 412C may be applied with different bias voltages by voltage source 80. For example, a voltage equal to 0V (a ground voltage) may be applied to metal pad 412A, hence the 0V voltage is applied on metal shield portion 57B. In the meantime, a negative voltage, which may be between about −0.01 volts and about −30 volts, may be applied on metal pad 412C, hence the negative voltage is applied on metal shield portion 57A and metal grid 66.

In the embodiments of the present disclosure, due to the formation and patterning scheme of two conductive layers, the Schottky contact may be monitored in real-time when the image sensor chip is formed, and may also be monitored after the color filters and micro-lenses are formed. Metal pads may be formed, so that bias voltages may be applied to the metal grid and the metal shield covering different circuit regions. Furthermore, color filters and micro-lenses are formed on a flat surface, and hence no process difficulty related to the topography of surface is incurred.

In accordance with some embodiments, a device includes a semiconductor substrate, a black reference circuit in the semiconductor substrate, a metal pad on a front side of, and underlying, the semiconductor substrate, and a first and a second conductive layer. The first conductive layer includes a first portion penetrating through the semiconductor substrate to connect to the metal pad, and a second portion forming a metal shield on a backside of the semiconductor substrate. The metal shield is aligned to the black reference circuit, and the first portion and the second portion are interconnected to form a continuous region. The second conductive layer includes a portion over and contacting the first portion of the first conductive layer, wherein the first portion of the first conductive layer and the portion of the second conductive layer form a first metal pad. A dielectric layer is overlying and contacting the second portion of the first conductive layer.

In accordance with other embodiments, a device includes a semiconductor substrate, a metal pad on a front side of, and underlying, the semiconductor substrate, a metal line on the front side of the semiconductor substrate, and a first conductive layer and a second conductive layer. The first conductive layer includes a first portion penetrating through the semiconductor substrate to connect to the metal pad, a second portion overlying and spaced apart from the semiconductor substrate, a third portion forming a conductive plug to physical contact the semiconductor substrate, and a fourth portion penetrating through the semiconductor substrate to connect to the metal line. The first portion, the second portion, and the third portion form a continuous region of the first conductive layer. The fourth portion is physically disconnected from the first, the second, and the third portions of the first conductive layer. The second conductive layer includes a first portion over and contacting the first portion of the first conductive layer and forming a first metal pad with the first portion of the first conductive layer, and a second portion over and contacting the second portion of the first conductive layer and forming a second metal pad with the second portion of the first conductive layer. The first and the second metal pads are electrically coupled to each other.

In accordance with yet other embodiments, a method includes forming a first and a second opening penetrating through a semiconductor substrate, forming a buffer oxide layer on a backside of the semiconductor substrate, patterning the buffer oxide layer to forming a third opening, and forming a first conductive layer on a backside of the semiconductor substrate and over the buffer oxide layer. The first conductive layer includes a first and a second portion extend into the first and the second openings to form lower portions of a first metal pad and a second metal pad, respectively, and a third portion extending into the third opening to contact the semiconductor substrate, wherein the third portion forms a conductive plug. The method further includes forming a second conductive layer over the first conductive layer. A first patterning step is performed to remove a first and a second portion of the second conductive layer, with the first conductive layer being used as an etch stop layer. The first portion of the second conductive layer overlaps the conductive plug, and the second portion of the second conductive layer is in an image sensor region. Portions of the second conductive layer remain to form upper portions of the first and the second metal pads. A second patterning step is performed to pattern the first conductive layer in the image sensor region to form a metal grid. After the second patterning step, the third portion of the first conductive layer is continuously connected to the first portion of the first conductive layer through un-patterned portions of the first conductive layer, and disconnected from the second portion of the first conductive layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
  a semiconductor substrate;
  a black reference circuit in the semiconductor substrate;
  a metal pad on a front side of, and underlying, the semiconductor substrate;

a first conductive layer comprising:
  a first portion penetrating through the semiconductor substrate to connect to the metal pad; and
  a second portion forming a metal shield on a backside of the semiconductor substrate, wherein the metal shield is aligned to the black reference circuit, and wherein the first portion and the second portion are interconnected to form a continuous region;
a second conductive layer comprising a first portion over and contacting the first portion of the first conductive layer, wherein the first portion of the first conductive layer and the first portion of the second conductive layer form a first metal pad; and
a dielectric layer over and contacting the second portion of the first conductive layer.

2. The device of claim 1, wherein the first conductive layer further comprises a third portion forming a metal grid, and wherein the second conductive layer does not extend overlying the metal grid.

3. The device of claim 1 further comprising:
a periphery circuit; and
a third portion of the first conductive layer forming an additional metal shield overlapping the periphery circuit, wherein the first portion, the second portion, and the third portion form a continuous region of the first conductive layer.

4. The device of claim 1 further comprising:
a periphery circuit;
a third portion of the first conductive layer forming an additional metal shield overlapping the periphery circuit; and
a second metal pad comprising:
  a fourth portion of the first conductive layer penetrating through the semiconductor substrate; and
  a second portion of the second conductive layer over and contacting the fourth portion of the first conductive layer, wherein the additional metal shield is electrically connected to the second metal pad and electrically disconnected from the first metal pad.

5. The device of claim 2, wherein the metal grid is electrically connected to the first metal pad.

6. The device of claim 2, wherein the metal grid and the metal shield form a continuous region of the first conductive layer.

7. The device of claim 2 further comprising image sensors aligned to the metal grid.

8. A device comprising:
a semiconductor substrate;
a metal pad on a front side of, and underlying, the semiconductor substrate;
a metal line on the front side of the semiconductor substrate;
a first conductive layer comprising:
  a first portion penetrating through the semiconductor substrate to connect to the metal pad;
  a second portion overlying and spaced apart from the semiconductor substrate;
  a third portion forming a conductive plug to physically contact the semiconductor substrate, wherein the first portion, the second portion, and the third portion form a continuous region of the first conductive layer;
  a fourth portion penetrating through the semiconductor substrate to connect to the metal line, wherein the fourth portion is physically disconnected from the first, the second, and the third portions of the first conductive layer; and
a second conductive layer comprising:
  a first portion over and contacting the first portion of the first conductive layer, and forming a first metal pad with the first portion of the first conductive layer; and
  a second portion over and contacting the second portion of the first conductive layer, and forming a second metal pad with the second portion of the first conductive layer, wherein the first and the second metal pads are electrically coupled to each other.

9. The device of claim 8 further comprising a buffer oxide layer between the second portion of the first conductive layer and the semiconductor substrate, wherein the conductive plug penetrates through the buffer oxide layer.

10. The device of claim 8 further comprising:
a p-well region in the semiconductor substrate and in contact with the conductive plug;
a silicide region at a front surface of the semiconductor substrate;
an Inter-Layer Dielectric (ILD) on the front side of the semiconductor substrate; and
a contact plug in the ILD and contacting the metal line, wherein the first and the second metal pads are electrically coupled with each other through the p-well region, the silicide region, and the contact plug.

11. The device of claim 8 further comprising a black reference circuit in the semiconductor substrate, wherein the first conductive layer comprises a portion overlapping the black reference circuit, and wherein the second conductive layer does not extend overlying the black reference circuit.

12. The device of claim 8, wherein the first conductive layer comprises:
a conductive barrier layer;
a metal-containing layer over the conductive layer; and
a conductive etch stop layer overlying the metal-containing layer.

13. The device of claim 8 further comprising an active image sensor array, wherein the first conductive layer extends overlying the image sensor array to form a metal grid.

14. The device of claim 8, wherein the first conductive layer comprises tungsten, and the second conductive layer comprises aluminum copper.

15. The device of claim 13, wherein the second conductive layer does not overlap the active image sensor array.

16. A method comprising:
forming a first and a second opening penetrating through a semiconductor substrate;
forming a buffer oxide layer on a backside of the semiconductor substrate;
patterning the buffer oxide layer to forming a third opening;
forming a first conductive layer on a backside of the semiconductor substrate and over the buffer oxide layer, wherein the first conductive layer comprises:
  a first and a second portion extend into the first and the second openings to form lower portions of a first metal pad and a second metal pad, respectively; and
  a third portion extending into the third opening to contact the semiconductor substrate, wherein the third portion forms a conductive plug;
forming a second conductive layer over the first conductive layer;
performing a first patterning step to remove a first and a second portion of the second conductive layer, with the first conductive layer being used as an etch stop layer, wherein the first portion of the second conductive layer overlaps the conductive plug, and the second portion of the second conductive layer is in an image sensor region, and wherein portions of the second conductive layer remain to form upper portions of the first and the second metal pads; and performing a second patterning step to pattern the first conductive layer in the image sensor region to form a metal grid, wherein after the second patterning step, the third portion of the first conductive layer is continuously connected to the first portion of the first conductive layer through un-patterned portions of the first conductive layer, and disconnected from the second portion of the first conductive layer.

17. The method of claim 16, wherein the semiconductor substrate comprises:
    a p-well region in the semiconductor substrate and in contact with the conductive plug;
    a silicide region at a front surface of the semiconductor substrate;
    an Inter-Layer Dielectric (ILD) on a front side of the semiconductor substrate; and
    a contact plug in the ILD, wherein the second metal pad is electrically coupled to the first metal pad through the p-well region, the silicide region, and the contact plug.

18. The method of claim 16 further comprising:
    after the second patterning step, forming a dielectric layer over the first and the second conductive layers;
    planarizing the dielectric layer;
    forming color filters and micro-lenses over the dielectric layer; and
    after the color filters and the micro-lenses are formed, removing portions of the dielectric layer covering the first and the second metal pads.

19. The method of claim 18 further comprising:
    after the second patterning step and before the dielectric layer is formed, probing the first metal pad and the second metal pad.

20. The method of claim 18 further comprising:
    after the color filters and the micro-lenses are formed, probing the first metal pad and the second metal pad.

* * * * *